(12) United States Patent
Ogiwara et al.

(10) Patent No.: US 7,426,147 B2
(45) Date of Patent: Sep. 16, 2008

(54) POWER SUPPLY VOLTAGE CONTROL CIRCUIT

(75) Inventors: Ryu Ogiwara, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 11/531,163

(22) Filed: Sep. 12, 2006

(65) Prior Publication Data

US 2007/0058420 A1    Mar. 15, 2007

(30) Foreign Application Priority Data

Sep. 13, 2005    (JP) .............................. 2005-265659

(51) Int. Cl.
G11C 5/14    (2006.01)
(52) U.S. Cl. ................... 365/189.09; 365/226; 365/227
(58) Field of Classification Search ............ 365/189.09, 365/226, 227
See application file for complete search history.

(56) References Cited

U.S. PATENT DOCUMENTS 7,260,013 B2 *    8/2007    Park et al. ................... 365/226

FOREIGN PATENT DOCUMENTS

JP    2003-196974    7/2003

OTHER PUBLICATIONS

D. Takashima, et al., "High-Density Chain Ferroelectric Random-Access Memory (CFRAM)", 1997 Symposium on VLSI Circuits Digest of Technical Papers, 1997, pp. 83-84.
Daisaburo Takashima, et al., "A Sub-40ns Random-Access Chain FRAM Architecture with a 7ns Cell-Plate-Line Drive", 1999 IEEE International Solid-State Circuits Conference, Session 6, Paper MP 6.1, Digest of Technical Papers, Feb. 15, 1999, pp. 102-103.

* cited by examiner

Primary Examiner—Son Dinh
Assistant Examiner—Nam Nguyen
(74) Attorney, Agent, or Firm—Oblon, Spivak, McClelland, Maier & Neustadt, P.C.

(57) ABSTRACT

A power supply voltage control circuit supplying a power supply voltage to a memory cell array, including word lines extending along row direction, bit lines extending along column direction, plate lines extending along the row direction, and a plurality of unit cells disposed at intersections of word lines and bit lines, includes a word line control circuit for supplying a first voltage to the word lines; and a plate line control circuit for supplying a second voltage to the plate lines; and the power supply voltage control circuit provides an amount of current flow from the first voltage so as to keep the first voltage potential almost constant during increasing a value of the second voltage in a power-on sequence, firstly increasing a value of the higher voltage of two potential voltages: the first voltage and the second voltage capacitive coupled, and then increasing a value of the lower second voltage.

20 Claims, 18 Drawing Sheets

RESET

CANCEL RESET

POWER SUPPLY VOLTAGE CONTROL CIRCUIT

CROSS REFERENCE TO RELATED APPLICATIONS AND INCORPORATION BY REFERENCE

This application is based upon and claims the benefit of priority from prior Japanese Patent Application P2005-265659 filed on Sep. 13, 2005; the entire contents of which are incorporated by reference herein.

BACKGROUND OF THE INVENTION

1. Field of the Invention

The present invention relates to a power supply voltage control circuit operative at the time of gradually increasing the value of turning on power. It particularly relates to a power supply voltage control circuit that is applied to a FeRAM having a 'TC unit' series-connected memory cell, hereinafter called as 'chain FeRAM', or that is applied to a FeRAM having a plurality of DRAM type memory cells, hereinafter called as 'FeRAM having DRAM type memory cell'. The chain FeRAM is defined to have a plurality of series-connected memory cells, each of the memory cell is constructed by connecting both electrodes of a ferroelectric capacitor $C_{FE}$ to a source/drain of a MOS transistor, respectively The FeRAM having a plurality of DRAM type memory cells is defined to have a circuit structure of memory cell transistor with a ferroelectric capacitor $C_{FE}$ connected in series to the source of the MOS transistor.

2. Description of the Related Art

In recent years, a FeRAM has been developed because it is nonvolatile and can read/write at a high speed. A FeRAM is characterized in that it is nonvolatile and is read out destructively, or data is destructed during an amount of voltage potential difference is applied between both electrodes of a ferroelectric capacitor.

A chain FeRAM is made up of a plurality of series connected memory cells, each of the memory cells is made by connecting the electrodes of a ferroelectric capacitor to a source and a drain of a MOS transistor, respectively. In order to prevent destruction of stored data due to an application of the voltage potential difference between the source and the drain electrode during a power-on sequence, it is required to apply the word line supply voltage VPP for driving memory cell transistors and then apply other various voltages.

Particularly, if the value of ½·VAA voltage potential, which is applied to bit lines, plate lines, and source, drain, and channel regions of the memory cell array during standby states, increases after the value of VPP potential is stepped up, the value of VPP itself further increases. This results emanates from a large amount of capacitive coupling between the electrode to which the value of VPP voltage potential is applied and the electrode to which the value of ½·VAA voltage potential is applied. Therefore, there is a problem that a high electric field is applied between the gate and source of the memory cell transistor, impairing reliability of the memory cell transistor as a result.

A semiconductor integrated circuit, which includes chain FeRAM cells, a VPP power supply circuit configured to generate the value of VPP power supply voltage supplied to the gate of the memory cell transistor in standby states, and a VAA power supply circuit configured to generate the value of VAA power supply voltage supplied to the source or drain of the memory cell transistor and is operational after the VPP power supply circuit starts working, after the value of the power supply voltage VDD is turned-on, and which is capable of suppressing degradation of data retention characteristics, has been disclosed (see Japanese Patent Application Laid-open No. 2003-196974, for example)

SUMMARY OF THE INVENTION

An aspect of the present invention inheres in a power supply voltage control circuit supplying a power supply voltage to a memory cell array, including a plurality of word lines extending along row direction, a plurality of bit lines extending along column direction, a plurality of plate lines extending along the row direction, and a plurality of unit cells disposed at intersections of a plurality of word lines and a plurality of bit lines, includes a word line control circuit for supplying a first voltage to the word lines; and a plate line control circuit for supplying a second voltage to the plate lines; and the power supply voltage control circuit provides an amount of current flow from the first voltage so as to keep the first voltage potential almost constant during increasing a value of the second voltage in a power-on sequence in which firstly increases a value of the higher voltage of two potential voltages: the first voltage and the second voltage capacitive coupled, and then increases a value of the lower second voltage.

Another aspect of the present invention inheres in a power supply voltage control circuit supplying a power supply voltage to a memory cell array, including a plurality of word lines extending along row direction, a plurality of bit lines extending along column direction, a plurality of plate lines extending along the row direction, and a plurality of unit cells disposed at intersections of a plurality of word lines and a plurality of bit lines, includes a word line control circuit for supplying a first voltage to the word lines; and a plate line control circuit for supplying a second voltage to the plate lines; and the power supply voltage control circuit firstly increases the value of the higher first voltage potential of two potential voltages: the first voltage and the second voltage capacitive coupled, up to the value of a voltage potential V1, and then increases the value of the second voltage potential up to the value of a voltage potential V2, and then increasing the value of the first voltage potential up to the value of a voltage potential V1 plus V2.

Another aspect of the present invention inheres in a power supply voltage control circuit supplying a power supply voltage to a memory cell array, including a plurality of word lines extending along row direction, a plurality of bit lines extending along column direction, a plurality of plate lines extending along the row direction, and a plurality of unit cells disposed at intersections of a plurality of word lines and a plurality of bit lines, includes a word line control circuit for supplying a first voltage to the word lines; and a plate line control circuit for supplying a second voltage to the plate lines; and the power supply voltage control circuit firstly increases the value of the higher first voltage of two potential voltages: the first voltage and the second voltage capacitive coupled, up to the value of a voltage potential V1 while resetting the value of the lower second voltage potential to the value of a voltage potential 0 V, cancels resetting of the lower second voltage potential and increases the value of the higher first voltage to the value of a voltage potential V2, and then increases the value of the lower second voltage potential to the value of a desired voltage potential V3, during which the value of the higher first voltage potential is kept on the value of the voltage potential V2, by providing an amount of current flow from the value of the first voltage potential to the value of the ground voltage potential.

DETAILED DESCRIPTION OF THE INVENTION

Figure 1:
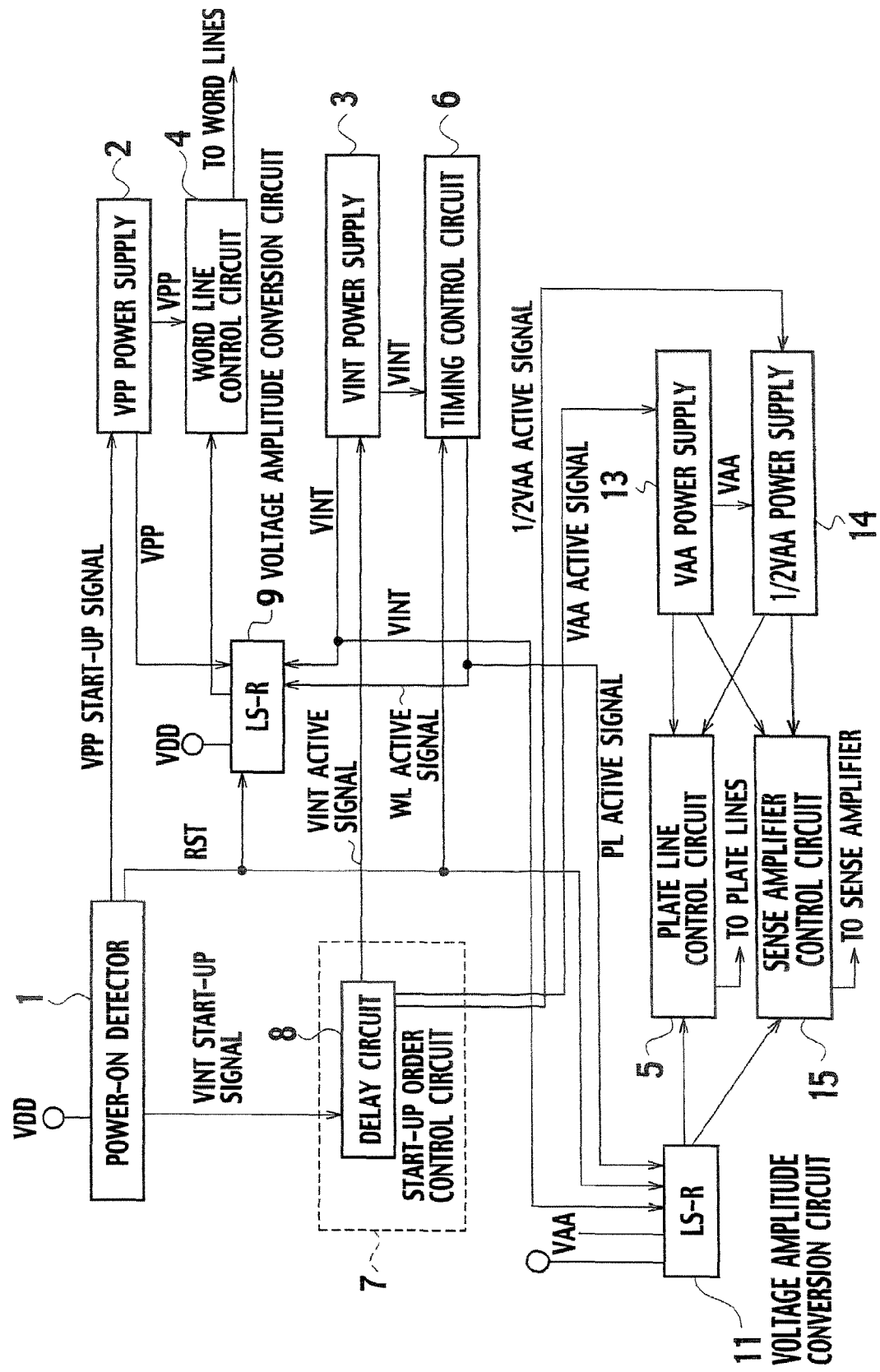
FIG. 1 is a schematic block diagram of a FeRAM to which a power supply voltage control circuit according to a first embodiment of the present invention is applied.

Various embodiments of the present invention will be described with reference to the accompanying drawings It is to be noted that the same or similar reference numerals are applied to the same or similar parts and elements throughout the drawings, and the description of the same or similar parts and elements will be omitted or simplified.

Referring to the drawings, embodiments of the present invention are described below. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

Next, a first to a fifth embodiment of the present invention are described while referencing drawings. The same or similar reference numerals are attached to the same or similar parts in the following drawing description. Note that those drawings are merely schematics and thus relationship between thickness of respective parts and two-dimensional size thereof and ratio of respective parts in thickness may be inconsistent with reality according to the present invention. Moreover, it is natural that there are parts differing in relationship and ratio of dimensions among the drawings.

The technical ideas according to the present invention may be modified into a variety of modifications within the scope of the claimed invention.

The present invention suppresses an increase in the VPP voltage due to capacitive coupling, suppresses a high electric field applied between a gate and a source of a memory cell transistor, and suppresses degradation of memory cell transistor reliability, in either the chain FeRAM or the FeRAM having DRAM type memory cell.

A power supply voltage control circuit of the present invention suppresses an increase in VPP voltage due to capacitive coupling, reduces the time delay necessary to return to a desired potential, and prevents the time delay in starting operation of a semiconductor chip, in the chain FeRAM or the FeRAM having DRAM type memory cell.

Note that the diagrams are merely schematics, and planar dimensions of respective blocks, respective power-on timings, and the like may differ from reality. Furthermore, needless to say, parts with differing dimensions and/or differing ratios may be included among the drawings.

The power supply voltage control circuit according to the embodiments of the present invention is capable of reducing an increase of the value of VPP voltage by discharging current from the VPP supply terminal when capacitive-coupling occurs, without impairing reliability of the memory cell transistor as a result.

Furthermore, the power supply voltage control circuit according to the embodiments of the present invention is capable of saving space and thus reducing occupied area on a semiconductor chip by using the VPP voltage discharge circuit as the VPP voltage monitor circuit.

Furthermore, the power supply voltage control circuit according to the embodiments of the present invention is capable of saving an amount of unnecessary discharged charges, by discharging current from the VPP voltage terminal to the ½·VAA voltage terminal.

Yet even further, the power supply voltage control circuit according to the embodiments of the present invention is capable of suppressing an increase in the VPP voltage due to capacitive-coupling, by increasing the value of the VPP voltage potential through two consecutive stages or three consecutive stages of the VPP potential voltage, without an amount of unnecessary discharged charges.

FIRST EMBODIMENT (First Example of Overall Block Configuration)

A power supply voltage control circuit according to the first embodiment of the present invention is applied to a FeRAM and includes a configuration shown in FIG. 1.

FIG. 1 is a schematic block diagram showing power supply circuits and associated peripheral circuits among several circuits included in the FeRAM.

As shown in FIG. 1, the power supply circuits and the associated peripheral circuits include a power-on detector circuit 1, a VPP power supply circuit 2, a VINT power supply circuit 3, a word line control circuit 4, a plate line control circuit 5, a timing control circuit 6, a VAA power supply circuit 13, a ½·VAA power supply circuit 14, and a sense amplifier control circuit 15.

As shown in FIG. 1, the power-on detector circuit 1 detects whether the value of the external power supply voltage VDD is reached up to a predetermined value, and then outputs a power supply start-up signal.

The power-on detector circuit 1, as shown in FIG. 1, outputs, for example, two power supply start-up signals: a VPP start-up signal and a VINT start-up signal, and outputs a reset signal RST so as to maintain the circuit in a reset state for a given period of time. The VPP start-up signal is provided to the VPP power supply circuit 2. The VINT start-up signal is provided to a start-up order control circuit 7 including a delay circuit 8. The delay circuit 8 then forwards the VINT active signal to the VINT power supply circuit 3.

As shown in FIG. 1, a VAA active signal and a ½·VAA active signal are generated from the delay circuit 8. The VAA active signal is provided to the VAA power supply circuit 13, and the ½·VAA active signal is provided to the ½·VAA power supply circuit 14.

The VPP power supply circuit 2 generates an internal power supply voltage VPP, as shown in FIG. 1. The internal power supply voltage VPP is supplied to, for example, a plurality of word lines and the word line control circuit 4, which controls each of the potential voltages of a plurality of word lines, in the power supply voltage control circuit according to the first embodiment of the present invention.

The VINT power supply circuit 3 generates an internal power supply voltage VINT, as shown in FIG. 1. The internal power supply voltage VINT is supplied to the plate line control circuit 5, which controls each of the potential voltages of a plurality of plate lines, the sense amplifier control circuit 15, which controls a sense amplifier, and a plurality of logic circuits, which controls operations of the entire semiconductor chip, for example, the timing control circuit 6.

The timing control circuit 6 outputs a WL active signal and a PL active signal, as shown in FIG. 1. The WL active signal is provided to the word line control circuit 4, and the PL active signal is provided to the plate line control circuit 5 and the sense amplifier control circuit 15.

The word line control circuit 4 is triggered by, for example, the WL active signal so as to control each of the potential voltages of a plurality of word lines, as shown in FIG. 1. The WL active signal goes through a voltage amplitude conversion circuit (LS-R) 9 before being provided to the word line control circuit 4. This is because the timing control circuit 6 operates with the internal power supply voltage VINT, and the word line control circuit 4 operates with the internal power supply voltage VPP.

The plate line control circuit 5 and the sense amplifier control circuit 15 are triggered by, the PL active signal so as to control each of the potential voltages of a plurality of plate lines and the voltage potential of the sense amplifier, respectively, as shown in FIG. 1. The PL active signal goes through a voltage amplitude conversion circuit (LS-R) 11 before being provided to the plate line control circuit 5 and the sense amplifier control circuit 15. This is because the timing control circuit 6 operates with the internal power supply voltage VINT, and the plate line control circuit 5 and the sense amplifier control circuit 15 operates with the internal power supply voltage VAA and the internal power supply voltage ½·VAA as respective power supply voltages.

The VAA power supply circuit 13 supplies an internal power supply voltage VAA to the plate line control circuit 5 and the sense amplifier control circuit 15, as shown in FIG. 1. The ½·VAA power supply 14 supplies an internal power supply voltage ½·VAA to the plate line control circuit 5 and the sense amplifier control circuit 15.

(Second Example of Overall Block Configuration)

Figure 2:
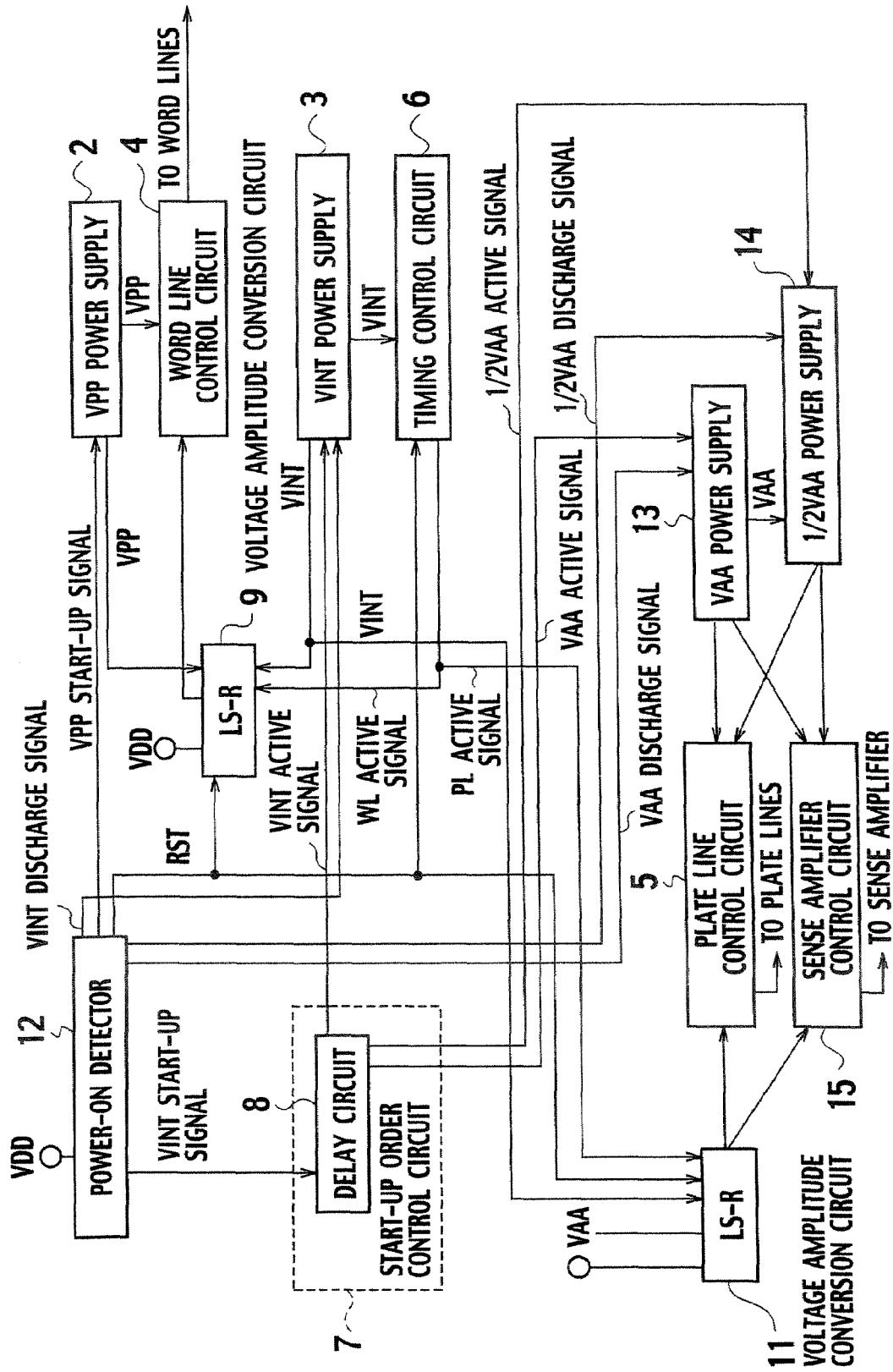
FIG. 2 is another schematic block diagram of a FeRAM to which the power supply voltage control circuit according to the first embodiment of the present invention is applied.

The power supply voltage control circuit according to the first embodiment of the present invention is also applied to another FeRAM configured as shown in FIG. 2.

FIG. 2 is a schematic block diagram showing power supply circuits and associated peripheral circuits among several circuits included in the FeRAM.

As shown in FIG. 2, the power supply circuits and the peripheral circuits include a power-on detector circuit 12, the VPP power supply circuit 2, the VINT power supply circuit 3, the word line control circuit 4, the plate line control circuit 5, the timing control circuit 6, the VA power supply circuit 13, the ½·VAA power supply circuit 14, and the sense amplifier control circuit 15.

As shown in FIG. 2, the power-on detector circuit 12 detects whether the value of the external power supply voltage VDD is reached up to a predetermined value, and then outputs a power supply start-up signal.

As shown in FIG. 2, the power-on detector circuit 12 outputs, for example, two power supply start-up signals: a VPP start-up signal and a VINT start-up signal, and outputs a reset signal RST so as to maintain the circuit in a reset state for a given period of time. The VPP start-up signal is provided to the VPP power supply circuit 2.

As shown in FIG. 2, the VINT start-up signal is provided to the start-up order control circuit 7 including the delay circuit 8. The delay circuit 8 then forwards the VINT active signal to the VINT power supply circuit 3.

As shown in FIG. 2, the delay circuit 8 generates a VAA active signal and a ½·VAA active signal. The VAA active signal is provided to the VAA power supply circuit 13, and the ½·VAA active signal is provided to the ½·VAA power supply circuit 14.

As shown in FIG. 2, the power-on detector circuit 12 generates three power supply discharge signals: a VINT discharge signal, a VAA discharge signal, and a ½·VAA discharge signal. The VINT discharge signal is provided to the VINT power supply circuit 3, the VAA discharge signal is provided to the VAA power supply circuit 13, and the ½·VAA discharge signal is provided to the ½·VAA power supply circuit 14.

The VPP power supply circuit 2 generates an internal power supply voltage VPP, as shown in FIG. 2. The internal power supply voltage VPP is supplied to, for example, a plurality of word lines and the word line control circuit 4, which controls each of the potential voltages of a plurality of word lines, in the power supply voltage control circuit according to the first embodiment of the present invention The VINT power supply circuit 3 generates an internal power supply voltage VINT, as shown in FIG. 2. The internal power supply voltage VINT is supplied to the plate line control circuit 5, which controls each of the potential voltages of a plurality of plate lines, the sense amplifier control circuit 15, which controls a sense amplifier, and a plurality of logic circuits, which controls operations of the entire semiconductor chip, and the timing control circuit 6 in the power supply voltage control circuit according to the first embodiment of the present invention.

The timing control circuit 6 outputs a WL active signal and a PL active signal, as shown in FIG. 2. The WL active signal is provided to the word line control circuit 4, and the PL active signal is provided to the plate line control circuit 5 and the sense amplifier control circuit 15.

The word line control circuit 4 is, for example, triggered by the WL active signal so as to control each of the potential voltages of a plurality of word lines, as shown in FIG. 2. The WL active signal goes through a voltage amplitude conversion circuit (LS-R) 9 before being provided to the word line control circuit 4. This is because the timing control circuit 6 operates with the internal power supply voltage VINT, and the word line control circuit 4 operates with the internal power supply voltage VPP.

The plate line control circuit 5 and the sense amplifier control circuit 15 are triggered by, for example, the PL active signal so as to control each of the potential voltages of a plurality of plate lines and the potential voltage of the sense amplifier, respectively, as shown in FIG. 2. The PL active signal goes through a voltage amplitude conversion circuit (LS-R) 11 before being provided to the plate line control circuit 5 and the sense amplifier control circuit 15. This is because the timing control circuit 6, operates with the internal power supply voltage VINT, and the plate line control circuit 5 and the sense amplifier control circuit 15 operate, with the VAA internal power supply voltage VAA and the internal power supply voltage ½·VAA, as respective power supply voltages.

The VAA power supply circuit 13 supplies an internal power supply voltage VAA to the plate line control circuit 5 and the sense amplifier control circuit 15, as shown in FIG. 2. The ½·VAA power supply circuit 14 supplies an internal power supply voltage ½·VAA to the plate line control circuit 5 and the sense amplifier control circuit 15.

The difference between the entire block structure, shown in FIG. 1, is that the power-on detector circuit 1 is replaced by the power-on detector circuit 12, as shown in FIG. 2.

The power-on detector circuit 12, as with the power-on detector circuit 1, detects whether the value of the external power supply voltage VDD has been reached up to a predetermined value, and then outputs a VPP start-up signal and a VINT start-up signal, and outputs a reset signal RST so as to maintain the circuit in a reset state for a given period of time.

(Third Example of Overall Block Configuration)

Figure 3:
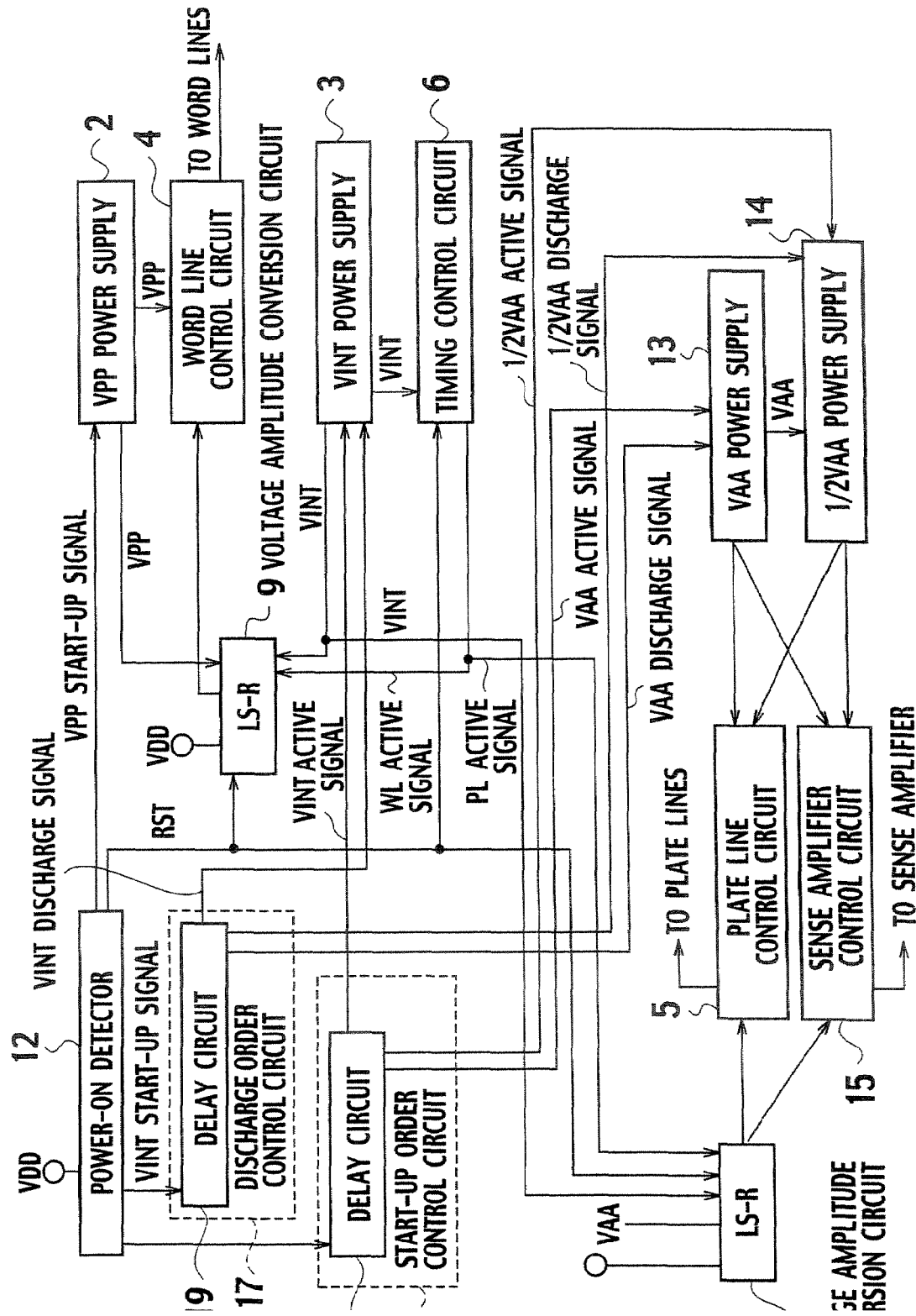
FIG. 3 is yet another schematic block diagram of a FeRAM to which the power-supply voltage control circuit according to the first embodiment of the present invention is applied.

The power supply voltage control circuit according to the first embodiment of the present invention is also applicable to yet another FeRAM configured as shown in FIG. 3.

FIG. 3 is a schematic block diagram showing power supply circuits and associated peripheral circuits among several circuits included in the FeRAM.

As shown in FIG. 3, the power supply circuits and the associated peripheral circuits include a power-on detector circuit 12, the VPP power supply circuit 2, the VINT power supply circuit 3, the word line control circuit 4, the plate line control circuit 5, the timing control circuit 6, the VAA power supply circuit 13, the ½·VAA power supply circuit 14, and the sense amplifier control circuit 15, for example.

As shown in FIG. 3, the power-on detector circuit 12 detects whether the value of the external power supply voltage VDD is reached up to a predetermined value, and then outputs a power supply start-up signal.

As shown in FIG. 3, the power-on detector circuit 12 outputs, for example, two power supply start-up signals: a VPP start-up signal and a VINT start-up signal, and outputs a reset signal RST so as to maintain the circuit in a reset state for a given period of time. The VPP start-up signal is provided to the VPP power supply 2.

As shown in FIG. 3, the VINT start-up signal is provided to the start-up order control circuit 7 including the delay circuit 8, and a discharge order control circuit 17 including the delay circuit 19.

As shown in FIG. 3, the delay circuit 8 generates a VAA active signal and a ½·VAA active signal. The VAA active signal is provided to the VAA power supply circuit 13, and the ½·VAA active signal is provided to the ½·VAA power supply circuit 14.

As shown in FIG. 3, the delay circuit 8 provides a VINT active signal to the VINT power supply circuit 3.

Moreover, as shown in FIG. 3, the delay circuit 19 generates three power supply discharge signals: a VINT discharge signal, a VAA discharge signal, and a ½·VAA discharge signal. The VINT discharge signal is provided to the VINT power supply circuit 3, the VAA discharge signal is provided to the VAA power supply circuit 13, and the ½·VAA discharge signal is provided to the ½·VAA power supply circuit 14.

The VPP power supply circuit 2 generates an internal power supply voltage VPP, as shown in FIG. 3. The internal power supply voltage VPP is supplied to, for example, a plurality of word lines and the word line control circuit 4, which controls each of the potential voltages of a plurality of word lines, in the power supply voltage control circuit according to the first embodiment of the present invention.

The VINT power supply circuit 3 generates an internal power supply voltage VINT, as shown in FIG. 3. The internal power supply voltage VINT is supplied to the plate line control circuit 5, which controls each of the potential voltages of a plurality of plate lines, the sense amplifier control circuit 15, which controls a sense amplifier, and a plurality of logic circuits, which controls operations of the entire semiconductor chip and the timing control circuit 6.

The timing control circuit 6 outputs a WL active signal and a PL active signal as shown in FIG. 3. The WL active signal is provided to the word line control circuit 4, and the PL active signal is provided to the plate line control circuit 5 and the sense amplifier control circuit 15.

The word line control circuit 4 is triggered by, for example, the WL active signal so as to control each of the potential voltages of a plurality of word lines, as shown in FIG. 3. The WL active signal goes through a voltage amplitude conversion circuit (LS-R) 9 before being provided to the word line control circuit 4. This is because the timing control circuit 6 operates with the internal power supply voltage VINT, and the word line control circuit 4 operates with the internal power supply voltage VPP.

The plate line control circuit 5 and the sense amplifier control circuit 15 are triggered by, for example, the PL active signal so as to control each of the potential voltages of a plurality of plate lines and the potential voltage of the sense amplifier, respectively, as shown in FIG. 3. The PL active signal goes through a voltage amplitude conversion circuit (LS-R) 11 before being provided to the plate line control circuit 5 and the sense amplifier control circuit 15. This is because the timing control circuit 6, operates with the internal power supply voltage VINT, and the plate line control circuit 5 and the sense amplifier control circuit 15, operate with the internal power supply voltage VAA and the internal power supply voltage ½·VAA, as respective power supply voltages.

The VAA power supply circuit 13 supplies an internal power supply voltage VAA to the plate line control circuit 5 and the sense amplifier control circuit 15, as shown in FIG. 3. The VAA power supply circuit 14 supplies an internal power supply voltage ½·VAA to the plate line control circuit 5 and the sense amplifier control circuit 15.

(Memory Cell Array)

(Chain FeRAM)

Figure 4:
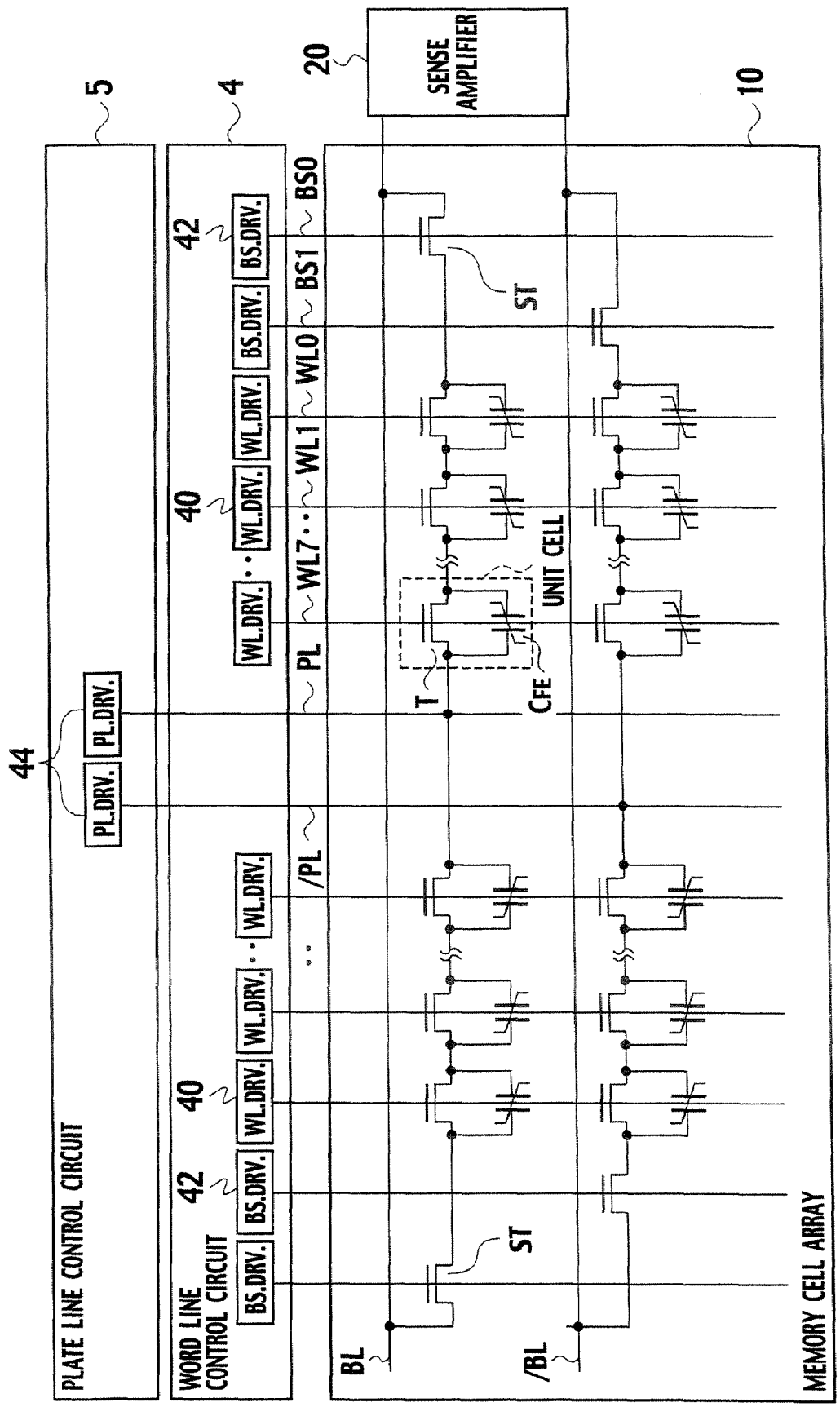
FIG. 4 is a schematic block diagram of an exemplary chain FeRAM cell array to which the power supply voltage control circuit according to the first embodiment of the present invention is applicable.

As shown in FIG. 4, an exemplary memory cell array to which the power supply voltage control circuit according to the first embodiment of the present invention is applicable includes a configuration of a chain FeRAM.

The chain FeRAM includes a memory cell array 10, the word line control circuit 4 connected to the memory cell array 10, and the plate line control circuit 5 connected to the word line control circuit 4, as shown in FIG. 4. In the memory cell array 10, a plurality of memory cells of the chain FeRAM is aligned in a matrix format.

Figure 5:
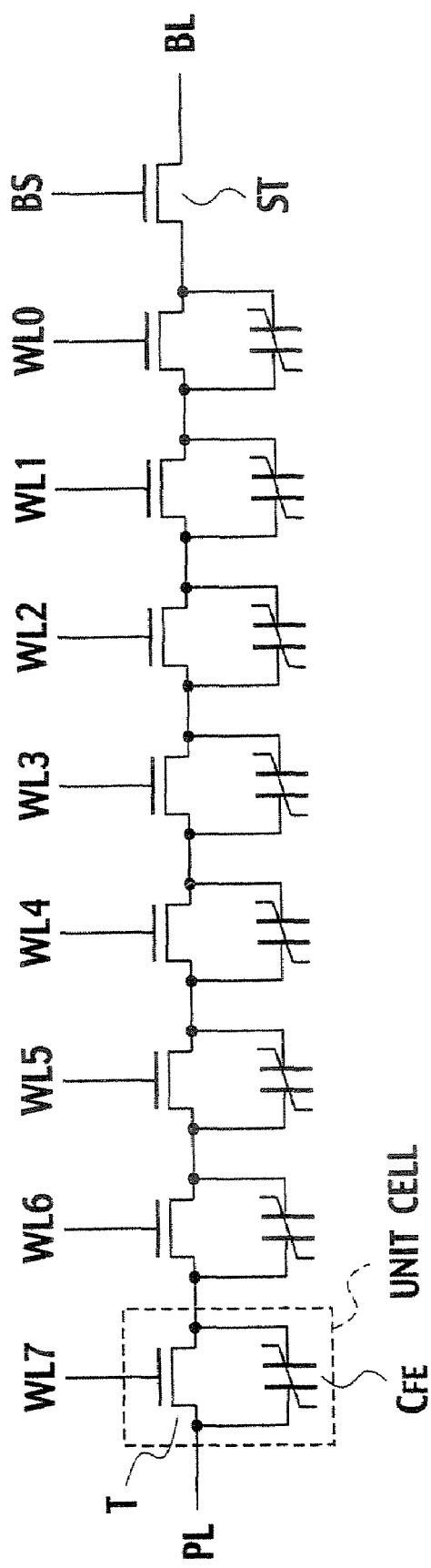
FIG. 5 is a circuit diagram of a chain FeRAM cell block in which a plurality of unit cells are connected in series between a bit line BL and a plate line PL.

Each of the memory cells of the chain FeRAM includes a configuration in which both electrodes of a ferroelectric capacitor $C_{FE}$ are connected to the source/drain of a memory cell transistor T, as shown in FIG. 5. A plurality of such unit cells is connected in series between plate lines PL and bit lines BL, as shown in FIG. 5. A block of such chain FeRAM cell strings, in which a plurality of memory cells of the chain FeRAM is connected in-series, is selected by a block select transistors ST. A word line WL (WL0 through WL7) is connected to the gate of each cell transistor T, and a block select line BS is connected to the gate of each block select transistor ST.

As shown in FIG. 4, a plurality of word lines WL (WL0 through WL7) are connected to word line drivers (WL.DRV.) 40, respectively, disposed in the word line control circuit 4, and a plurality of block select lines BS (BS0, BS1) are connected to block select line drivers (BS.DRV.) 42, respectively, disposed in the word line control circuit 4. A plurality of plate lines PL (PL,/PL) are connected to plate line drivers (PL.DRV) 44, respectively, disposed in the plate line control circuit 5.

As shown in FIG. 4, the memory cell array 10 includes a configuration in which chain FeRAM blocks are arranged in parallel, extending along the row direction of the word lines WL (WL0 through WL7). Furthermore, as shown in FIG. 4, the memory cell array 10 includes a configuration in which chain FeRAM blocks are arranged symmetrically with the plate lines PL (PL,/PL) as the center thereof, extending along the column direction of the bit lines BL (BL,/BL).

In an operation of the chain FeRAM cell array, potential voltages of a plurality of word lines WL (WL0 through WL7) and potential voltages of a plurality of block select lines BS (BS0, BS1) take the value of either the internal power supply voltage VPP or the value of ground voltage potential GND, 0 V, for example. Furthermore, in a standby state, the value of the potential voltages of a plurality of word lines WL (WL0 through WL7) equals to the value of the internal power supply voltage VPP, and the value of the potential voltages of a plurality of block select lines BS (BS0, BS1) equals to the value of ground voltage potential GND, 0 V.

Potential voltages of a plurality of plate lines PL (PL,/PL) take the value of either the internal power supply voltage VAA, ½·VAA or the ground voltage potential GND, 0 V or the value of ½·VAA. In a standby state, the value of the potential voltages of a plurality of plate lines PL (PL,/PL) equals to the value of ½·VAA.

A sense amplifier 20 is connected to a pair of bit lines BL (BL,/BL) so as to read out differentially amplified and fixed high/low level signals from the FeRAM cells. In a standby state, the value of the potential voltages of a plurality of bit lines BL (BL,/BL) equals to the value of ½·VAA.

(FeRAM Having DRAM Type Memory Cell)

Figure 6:
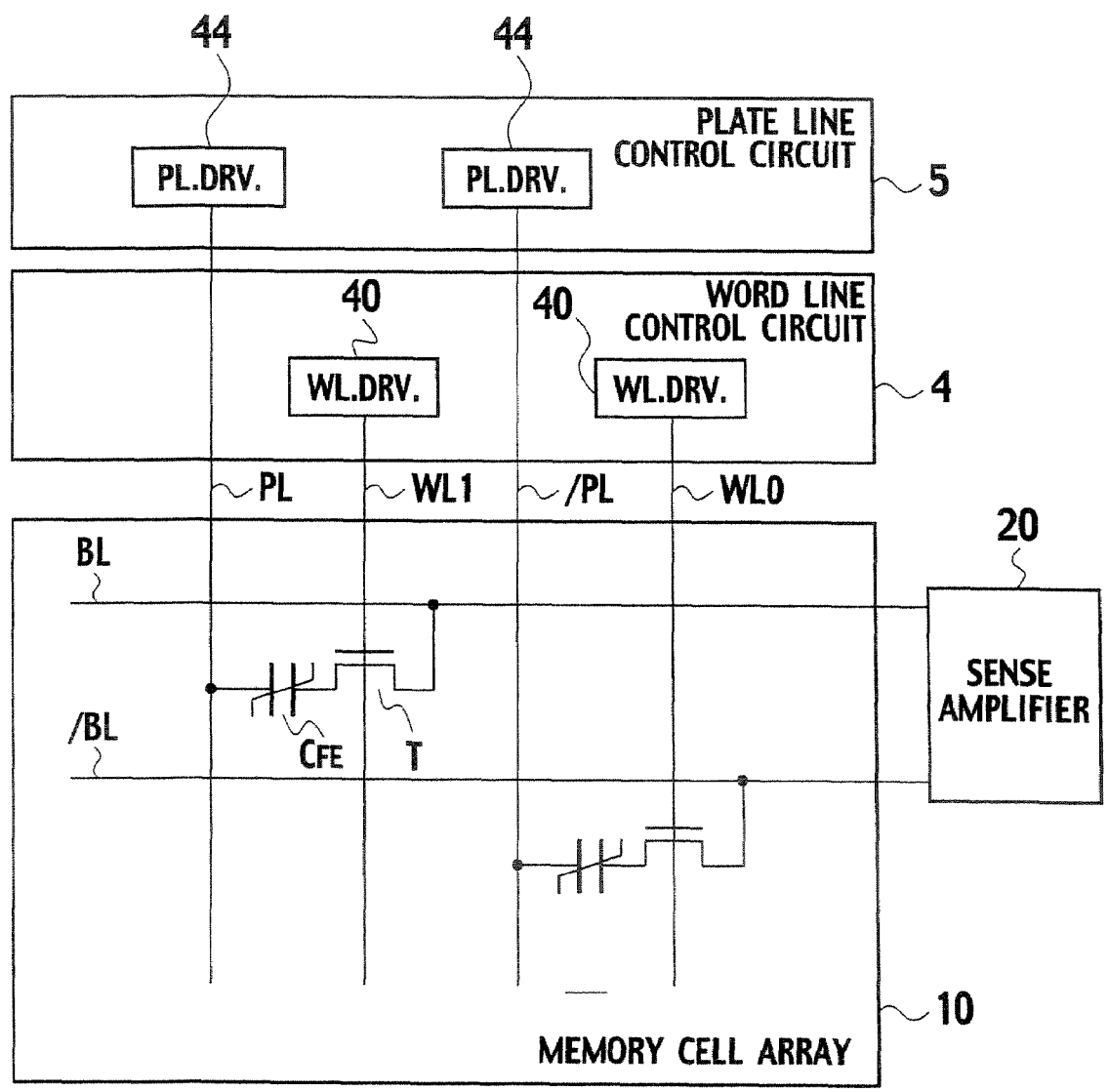
FIG. 6 is a schematic block diagram of an exemplary FeRAM cell array having a plurality of DRAM type memory cells to which the power supply voltage control circuit according to the first embodiment of the present invention is applicable.

As shown in FIG. 6, another exemplary memory cell array to which the power supply voltage control circuit according to the first embodiment of the present invention is applicable includes a configuration of a FeRAM having DRAM type memory cell.

The FeRAM having a plurality of DRAM type memory cells includes the memory cell array 10, the word line control circuit 4 connected to the memory cell array 10, and the plate line control circuit 5 connected to the word line control circuit 4, as shown in FIG. 6. A plurality of DRAM type memory cells is integrated in the memory cell array 10.

The unit cell having the DRAM type memory cell includes a configuration in which a ferroelectric capacitor $C_{FE}$ is series-connected to the source of a cell transistor T, as shown in FIG. 6, for example. Such unit cells are arranged at intersections of a plurality of plate lines PL (PL,/PL) and a plurality of bit lines BL (BL,/BL), constituting a matrix format, as shown in FIG. 6. Each word line of a plurality of word lines WL (WL0, WL1 . . . ) is connected to a respective gate of cell transistors T. The opposite electrode to a respective electrode of the ferroelectric capacitors $C_{FE}$ connected to the respective source of the cell transistors T is connected to each of a plurality of plate lines PL (PL,/PL). Each bit line of a plurality of bit lines BL (BL,/BL) is connected to the drain of the cell transistors T.

As shown in FIG. 6, each word line of a plurality of word lines WL (WL0, WL1 . . . ) is connected to each word line driver of a plurality of word line drivers (WL.DRV.) 40, respectively, disposed in the word line control circuit 4 while each plate line of a plurality of the plate lines PL (PL,/PL) are connected to each plate line driver of a plurality of plate line drivers (PL.DRV.) 44, respectively, disposed in the plate line control circuit 5.

In an operation of the cell array of the FeRAM having a plurality of DRAM type memory cells, potential voltages of a plurality of word lines WL (WL0, WL1 . . . ) take the value of either the internal power supply voltage VPP or the value of ground voltage potential GND, 0 V, for example. In a standby state, the value of the potential voltage of a plurality of word lines WL (WL0, WL1 . . . ) equals to the value of ground voltage potential GND, 0 V.

The value of the potential voltages of a plurality of plate lines PL (PL,/PL) take the value of either the internal power supply voltage VAA, ½·VAA or the value of ground voltage potential GND, 0 V.

A sense amplifier 20 is connected to a pair of bit lines BL (BL,/BL) so as to read out differentially amplified and fixed high/low level signals from the memory cell. In a standby state, the value of the potential voltages of a plurality of bit lines BL (BL,/BL) equals to the value of the groundvoltage potential GND, 0 V or the value of ½·VAA.

(Power Supply Voltage Control Circuit)

A power supply voltage control circuit according to the first embodiment of the present invention supplies a power supply voltage to a memory cell array 10, which includes a plurality of word lines WL extending along the row direction, a plurality of bit lines BL extending along the column direction, a plurality of plate lines PL extending along the row direction, and a plurality of unit cells disposed at intersections of a plurality of word lines WL and a plurality of bit lines BL.

The memory cell array provides a FeRAM having a TC unit series connected memory cell configuration in which a plurality of unit cells is connected in series between the bit line BL and the plate line PL and each unit cell made up of the memory cell transistor T having the drain, the source, and the gate connected to the word line WL, and a ferroelectric capacitor $C_{FE}$ connected in parallel between the source and drain of the memory cell transistor T.

Alternatively, the memory cell array provides a FeRAM having a plurality of DRAM type memory cells in which a plurality of unit cells is connected in a matrix format and each unit cell made up of a memory cell transistor T having the drain connected to the bit line BL, the gate connected to the word line WL, and a ferroelectric capacitor $C_{FE}$ having an electrode connected to the plate line PL and the other electrode connected to the source of the memory cell transistor T.

As shown in FIG. 4 or FIG. 6, the word line control circuit 4 includes a plurality of word line drivers 40, which supplies the VPP voltage to the word lines WL and the plate line control circuit 5 includes a plurality of plate line drivers 44, which supplies ½·VAA voltage to the plate lines PL.

Figure 8:
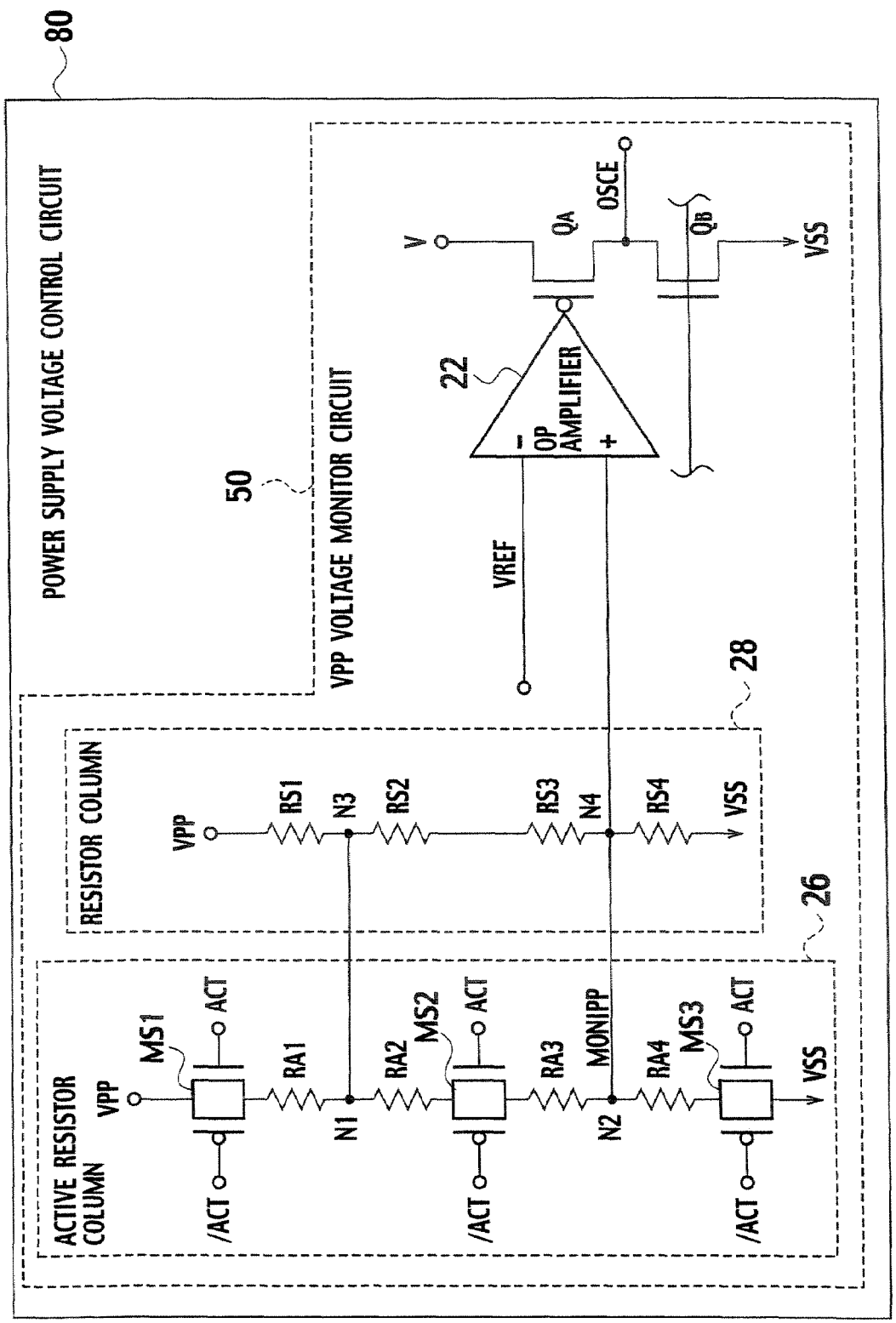
FIG. 8 is a schematic circuit diagram of a VPP voltage monitor circuit in the power supply voltage control circuit according to the first embodiment of the present invention.

As shown in FIG. 8, the power supply voltage control circuit 80 comprises the VPP voltage monitor circuit 50 having an active resistor column 26 through which current flows in an active operational state and a resistor column 28 through which normally current flows even in a standby state. The VPP voltage monitor circuit 50 monitors the VPP voltage supplied to the word lines.

In yet another alternatively, the power supply voltage control circuit 80 according to the first embodiment of the present invention provides the current flow from the VPP voltage terminal down to the VSS terminal so as to keep the VPP voltage potential almost constant during increasing the ½·VAA voltage in a power-on sequence which firstly increases the higher VPP voltage potential of two potential voltages: VPP and ½·VAA capacitive coupled, and then increases the lower ½·VAA voltage potential.

Alternatively, with the power supply voltage control circuit 80 according to the first embodiment of the present invention, the current flow from the VPP voltage terminal to the VSS terminal is along both through the active resistor column 26 and the resistor column 28 of the VPP voltage monitor circuit 50.

The power supply voltage control circuit 80 according to the first embodiment of the present invention is described using FIGS. 7 through 10.

Figure 7:
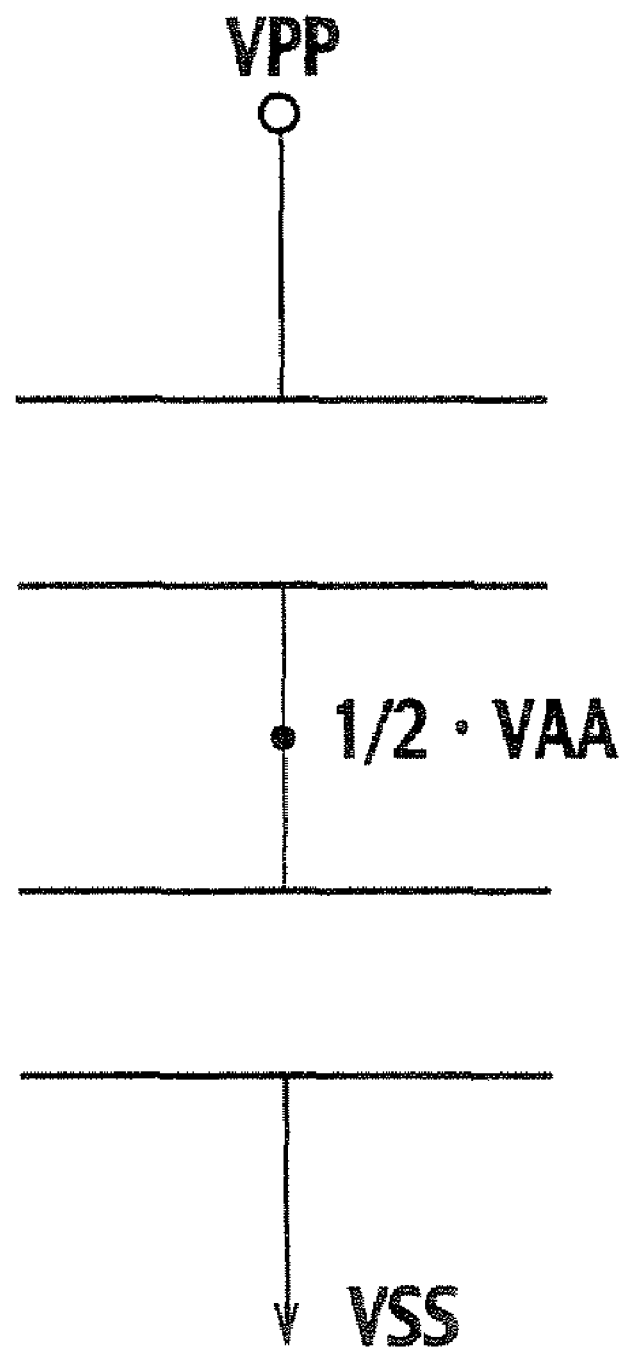
FIG. 7 is a circuit diagram schematically showing a capacitive coupling of a VPP voltage and a ½·VAA voltage in the power supply voltage control circuit according to the first embodiment of the present invention.
Figure 9:
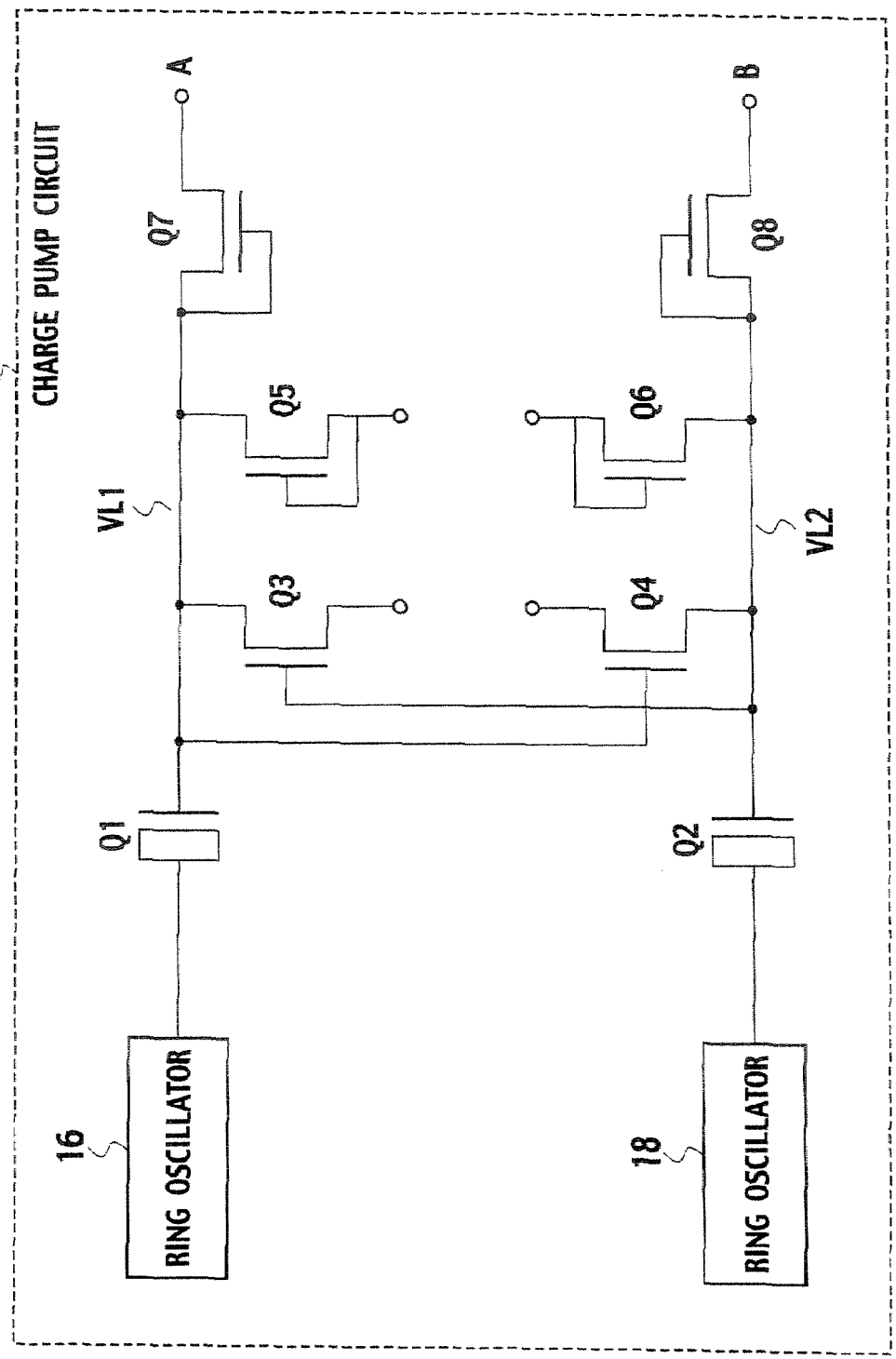
FIG. 9 is a schematic diagram of a charge pump circuit for generating a VPP voltage for increasing the value of word line voltage potential in the power supply voltage control circuit according to the first embodiment of the present invention.
Figure 10:
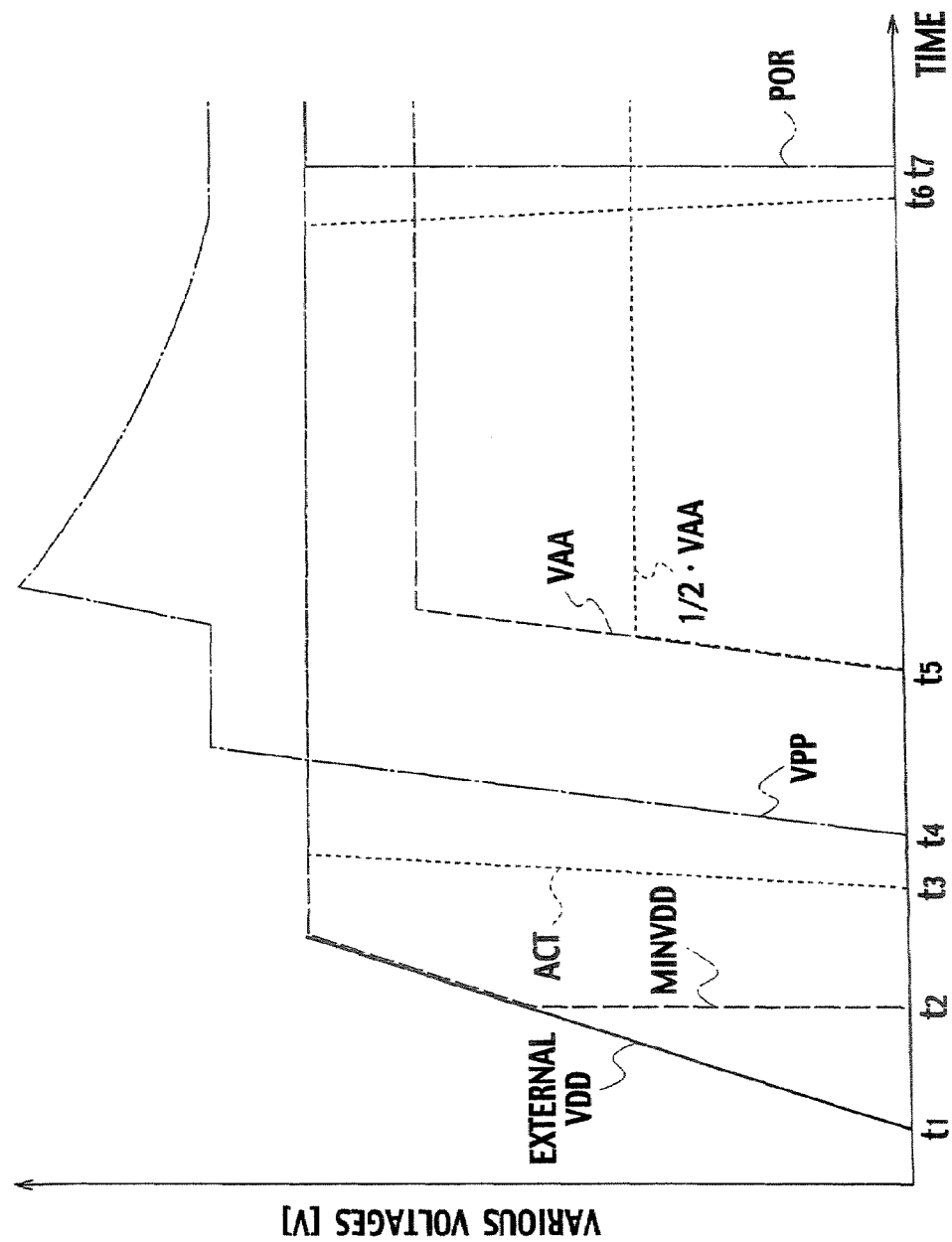
FIG. 10 is a schematic waveform diagram showing a power-on sequence for various voltages at main nodes in the power supply voltage control circuit, according to the first embodiment of the present invention, during a power-on sequence.

FIG. 7 is a circuit diagram schematically showing capacitive coupling of the VPP voltage potential applied to the word lines with the ½·VAA voltage potential applied to the bit lines BL, the plate lines PL, the source, drain, and channel regions of the cell transistors T within the memory cell array during in a standby state. FIG. 8 shows a schematic configuration of the VPP voltage monitor circuit 50, which monitors the VPP voltage supplied to the word lines, having resistor columns 26, 28 and an operational amplifier 22, while FIG. 9 is a schematic circuit diagram of a charge pump circuit 60 for generating a VPP voltage for increasing the value of word line voltage potential in the power supply voltage control circuit according to the first embodiment of the present invention. FIG. 10 shows waveforms of various voltages at the main nodes during a power-on sequence.

As shown in FIG. 8, the power supply voltage control circuit 80 according to the first embodiment of the present invention includes the VPP voltage monitor circuit 50, which is constructed by an operational amplifier (OP amplifier) 22 having an input terminal connected to a reference voltage VREF and another input terminal connected to a VPP monitor voltage MONIPP, a p-channel MOS transistor QA having a gate electrode connected to the output terminal of the OP amplifier 22, an n-channel MOS transistor QB series-connected to the p-channel MOS transistor QA, the active resistor column 26 series-coupled to a VPP voltage terminal and a VSS voltage terminal and through which current flows during the active resistor column 26 is in an active state, and a resistor column 28 series-coupled to a VPP voltage terminal and a VSS voltage terminal and through which current flows normally.

An output voltage potential OSCE is detected at a connecting node between the p-channel MOS transistor QA and the n-channel MOS transistor QB.

The active resistor column 26 is coupled between the VPP voltage terminal and the VSS voltage terminal, and includes MOS transfer switches MS (MS1, MS2, and MS3) and resistors RA (RA1, RA2, RA3) series-connected to the respective MOS transfer switches MS (MS1, MS2, and MS3). Each of the MOS transfer switches MS (MS1, MS2, and MS3) is made up of a parallel circuit of an n-channel MOS transistor and a p-channel MOS transistor having respective gate electrodes to which respective active signals ACT (ACT,/ACT) are provided.

The resistor column 28 includes resistors RS (RS1, RS2, RS3, RS4) series-coupled to the VPP voltage terminal and the VSS voltage terminal.

In the VPP voltage monitor circuit 50 shown in FIG. 8, the VPP monitor voltage MONIPP is detected as a common voltage potential of a connecting node N2 and a connecting node 4 connected thereto; where the connecting node N2 is disposed between the resistors RA3 and RA4 in the active resistor column 26 while the connecting node 4 is disposed between the resistors RS3 and RS4 in the resistor column 28. Note that as shown in FIG. 8, a connecting node N1 between the resistors RA1 and RA2 in the active resistor column 26 and a connecting node N3 between the resistors RS1 and RS2 in the resistor column 28 are connected to each other.

The resistor columns 26, 28 in FIG. 8 are characterized by parallel circuit connection: one resistor column 26 having a small resistor value in an active operational state and another column 28 having a large resistor value. In other words, the resistor columns in FIG. 8, including the active resistor column 26 through which current flows in an active operational state and the resistor column 28 through which current flows normally, are capable of reducing the value of the current consumption by making current flow through the resistor column 28 in a standby state. Also, a faster response is achieved by making current flow through the active resistor column 26 in an active operational state.

In the power supply voltage control circuit 80 according to the first embodiment of the present invention, the charge pump circuit 60, for generating a VPP voltage for increasing the value of word line voltage potential, includes, as shown in FIG. 9, for example, a ring oscillator 16, a MOS transistor Q1 connected to the ring oscillator 16 and constituting a charge pump capacitor for increasing the value of the voltage potential of a power line VL1, a MOS transistor Q3 for providing an amount of current to the power line VL1, a load transistor Q5 for the power line VL1, a transfer switch MOS transistor Q7 connected between the power line VL1 and an output terminal A, a ring oscillator 18, a MOS transistor Q2 connected to the ring oscillator 18 and constituting a charge pump capacitor for increasing the value of the voltage potential of a power line VL2, a MOS transistor Q4 for providing an amount of current to the power line VL2, a load transistor Q6 for the power line VL2, and a transfer switch MOS transistor Q8 connected between the power line VL2 and an output terminal B.

(Power-On Sequence)

A schematic waveform diagram showing a power-on sequence for various voltages at main nodes in the power supply voltage control circuit, according to the first embodiment of the present invention, during a power-on sequence is shown in FIG. 10.

(a) To begin with, the external power supply voltage VDD starts to increase at time t1, and the logic signal level MINVDD in response to the value of VDD starts to rise up at time t2.

(b) Next, the ACT signal is provided at time t3, and the value of the ACT signal is maintained at a constant value.

(c) Next, the value of the VPP voltage starts to increase at time t4, and the value of the VPP voltage is maintained at a constant value once a given period of time has elapsed.

(d) Next, the value of the ½·VAA voltage starts to increase in accordance with the increase of the value of the VAA voltage at time t5. The value of the ½·VAA voltage and the value of the VAA voltage are maintained at respective constant values, once a given period of time has elapsed. At the same time, as shown in FIG. 10, the value of the VPP voltage increases due to capacitive-coupling in accordance with the increase of the value of the ½·VAA voltage.

(e) Next, the value of the ACT signal decreases to a zero voltage at time t6.

(f) Next, once the value of the VPP voltage is decreased and stabilized to the constant predetermined value, the power-on reset signal POR is turned on at time t7, and then is kept on the high level of the power-on reset signal POR.

The time period until the value of the increased VPP voltage is decreased and stabilized to the constant predetermined value corresponds to the time duration between the time t5 and the time t6. During the time period until the value of the increased VPP voltage is decreased and stabilized to the constant predetermined value, an amount of discharge current flows from the VPP voltage terminal to the VSS voltage terminal through the parallel circuit of the active resistor column 26 and the resistor column 28, by keeping the operational state of the VPP voltage monitor circuit 50 on an active operational state.

With the power supply voltage control circuit 80 according to the first embodiment of the present invention, the operational state of the VPP voltage monitor circuit 50 is maintained in an active state, during the time period until the value of the increased VPP voltage is decreased and stabilized to the constant predetermined value, after the VPP voltage is first gradually increasing at time t4, the value of the ½·VAA voltage is gradually increasing in accordance with the increase of the value of the VAA voltage at time t5, and the value of the VPP voltage temporarily increases due to capacitive-coupling in accordance with the increase of the value of the ½·VAA voltage. Thereby a large amount of discharge current flows from the VPP voltage terminal to the VSS voltage terminal, and the value of the boosted VPP voltage occurring due to the capacitive-coupling is quickly decreased and stabilized to the constant predetermined value, in accordance with the power-on sequence of FIG. 10.

The power supply voltage control circuit 80 according to the first embodiment of the present invention allows the boosted VPP voltage due to capacitive-coupling to return to the decreased and stabilized constant value in a high speed manner

SECOND EMBODIMENT

A power supply voltage control circuit according to the second embodiment of the present invention is applied to the FeRAM configured as shown in FIGS. 1 through 3, as with the first embodiment.

As shown in FIG. 4, an exemplary memory cell array to which the power supply voltage control circuit according to the second embodiment of the present invention is applicable includes a configuration of the chain FeRAM, as with the first embodiment.

Alternatively, as shown in FIG. 6, another exemplary memory cell array to which the power supply voltage control circuit according to the second embodiment of the present invention is applicable includes a configuration of the FeRAM having DRAM type memory cell, as with the first embodiment.

The power supply voltage control circuit according to the second embodiment of the present invention supplies a power supply voltage to the memory cell array 10, which includes a plurality of word lines WL extending along the row direction, a plurality of bit lines BL extending along the column direction, a plurality of plate lines PL extending along the row direction, and a plurality of unit cells disposed at intersections of a plurality of word lines WL and a plurality of bit lines BL.

The memory cell array provides a FeRAM having a TC unit series connected memory cell configuration in which a plurality of unit cells is connected in series between the bit line BL and the plate line PL and each unit cell made up of the memory cell transistor T having the drain, the source, and the gate connected to the word line WL, and a ferroelectric capacitor $C_{FE}$ connected in parallel between the source and drain of the memory cell transistor T.

Alternatively, the memory cell array provides a FeRAM having a plurality of DRAM type memory cells in which a plurality of unit cells is connected in a matrix format and each unit cell made up of a memory cell transistor T having the drain connected to the bit line BL, the gate connected to the word line WL, and a ferroelectric capacitor $C_{FE}$ having an electrode connected to the plate line PL and the other electrode connected to the source of the memory cell transistor T.

As shown in FIG. 4 or FIG. 6, the word line control circuit 4 includes a plurality of word line drivers 40, which supplies the VPP voltage to the word lines WL and the plate line control circuit 5 includes a plurality of plate line drivers 44, which supplies ½·VAA voltage to the plate lines PL.

Figure 11:
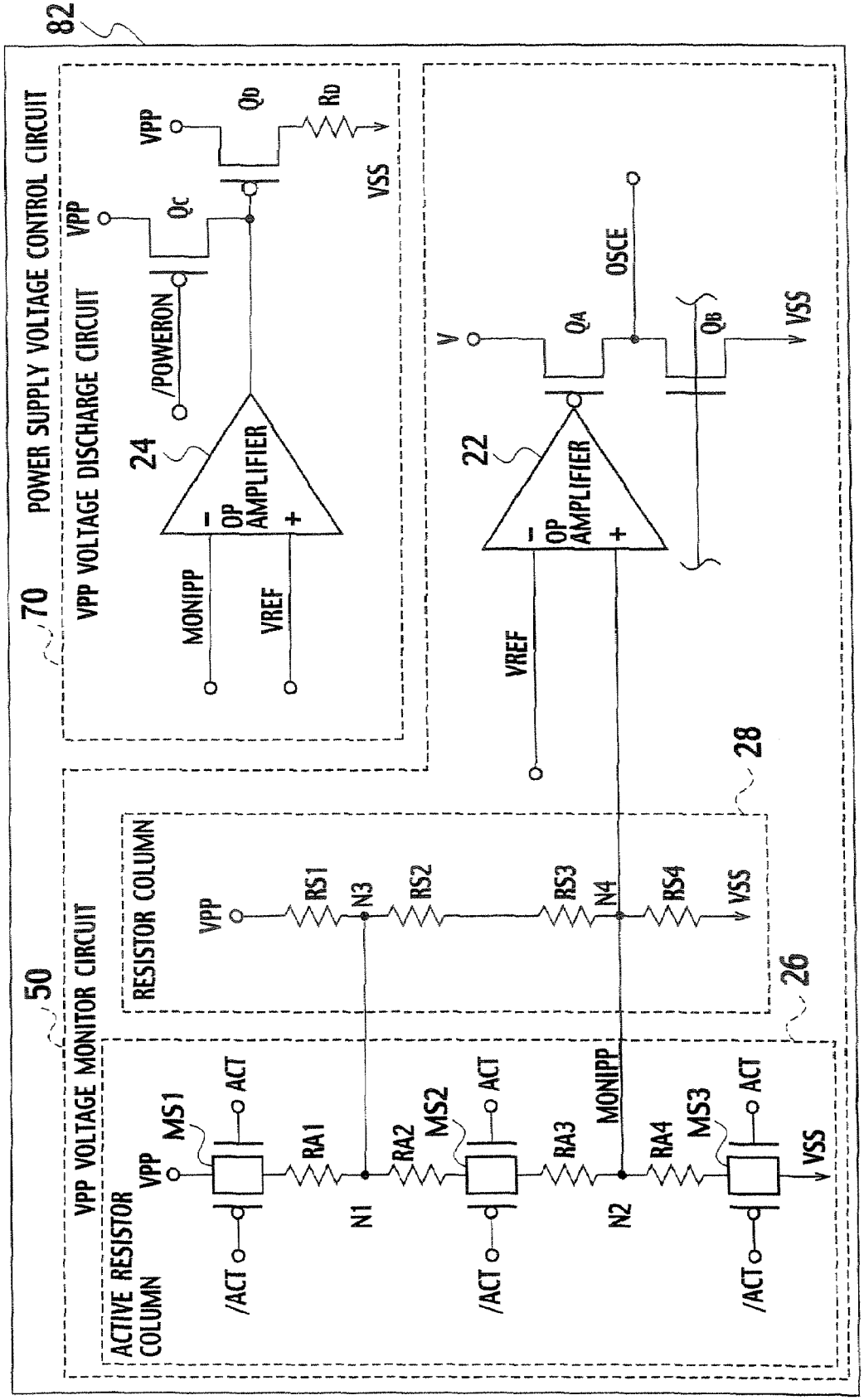
FIG. 11 is a schematic circuit diagram of a VPP voltage monitor circuit and a VPP voltage discharge circuit in a power supply voltage control circuit according to a second embodiment of the present invention.

As shown in FIG. 11, the power supply voltage control circuit 82 comprises the VPP voltage monitor circuit 50 having an active resistor column 26 through which current flows during in an active operational state and a resistor column 28 through which normally current flows even during in a standby state. The VPP voltage monitor circuit 50 monitors the VPP voltage supplied to the word lines WL.

As shown in FIG. 11, the power supply voltage control circuit 82 according to the second embodiment of the present invention includes the VPP voltage discharge circuit 70, which discharges the value of the VPP voltage applied to the word lines WL.

As shown in FIG. 11, the power supply voltage control circuit 82 according to the second embodiment of the present invention includes the VPP voltage discharge circuit 70 that discharges an amount of current so as to provide the current flow from the value of the VPP voltage potential, in addition to the VPP voltage monitor circuit 50.

With the power supply voltage control circuit 82 according to the second embodiment of the present invention, the VPP voltage discharge circuit 70 is configured to discharge an amount of current from the value of the VPP voltage potential to the value of the VSS ground voltage, 0 V.

Figure 12:
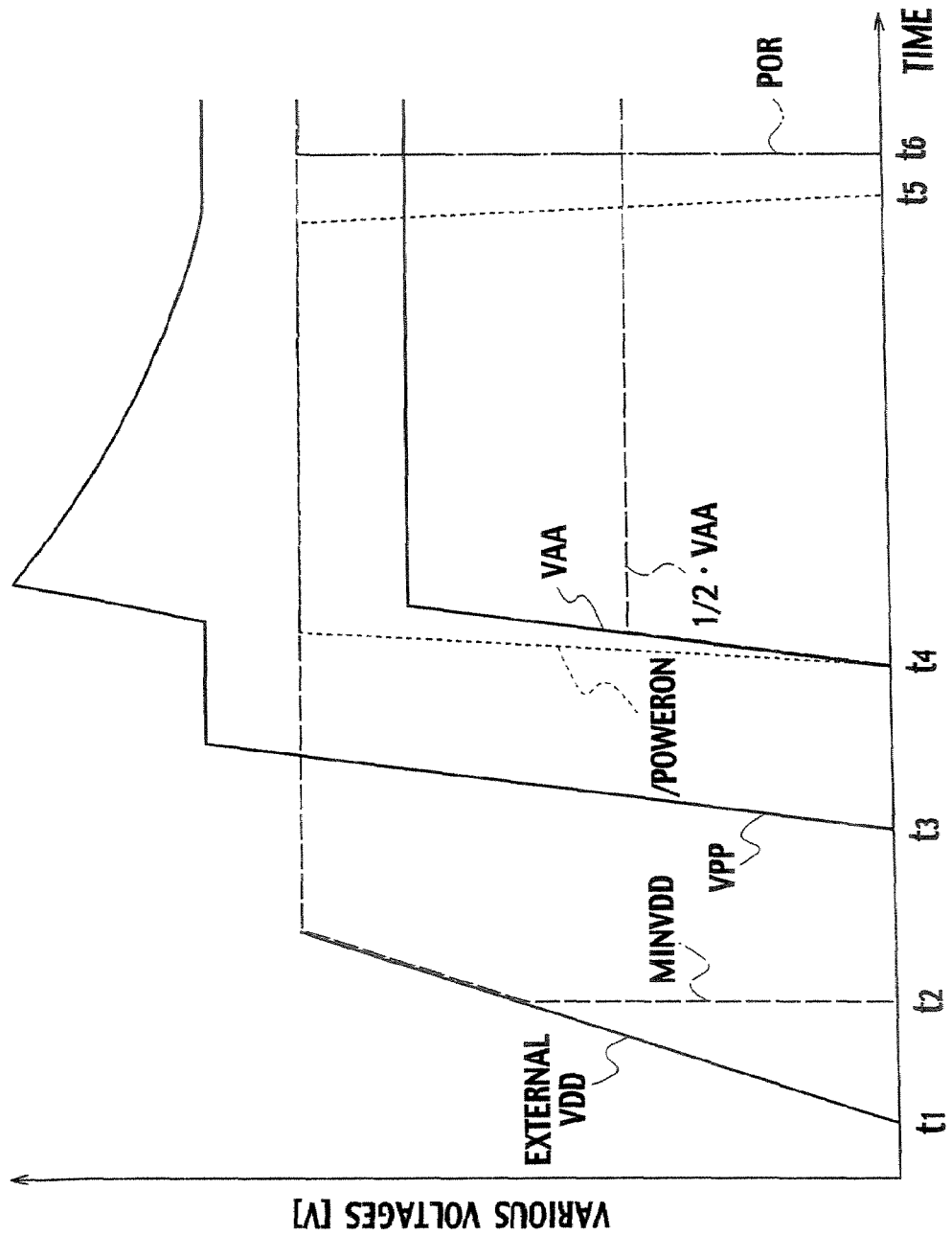
FIG. 12 is a schematic waveform diagram showing a power-on sequence for various voltages at main nodes in the power supply voltage control circuit, according to the second embodiment of the present invention, during a power-on sequence.

The power supply voltage control circuit 82 according to the second embodiment of the present invention is described using FIGS. 11 and 12.

As shown in FIG. 11, the power supply voltage control circuit 82 according to the second embodiment of the present invention includes the VPP voltage monitor circuit 50 and the VPP voltage discharge circuit 70.

The VPP voltage monitor circuit 50 includes the same circuit configuration as the power supply voltage control circuit 80 according to the first embodiment of the present invention, and, as shown in FIG. 11, includes the OP amplifier 22 having an input terminal connected to the reference voltage VREF and another input terminal connected to the VPP monitor voltage MONIPP, the p-channel MOS transistor QA having the gate electrode connected to the output terminal of the OP amplifier 22, the n-channel MOS transistor QB series-connected to the p-channel MOS transistor QA, the active resistor column 26 series-coupled to the VPP voltage and the VSS voltage and through which a large amount current flows during in an active operational state, and the resistor column 28 series-coupled to the VPP voltage and the VSS voltage and through which a small amount of current flows normally.

The VPP voltage discharge circuit 70 includes an OP amplifier 24 having an input terminal coupled to the reference voltage VREF and the other input terminal coupled to the VPP monitor voltage MONIPP, a p-channel MOS transistor QD having a gate electrode connected to the output terminal of the OP amplifier 24, a p-channel MOS transistor QC having a source electrode connected to the output terminal of the OP amplifier 24, and a discharge resistor RD connected between the source electrode of the p-channel MOS transistor QD and the VSS ground voltage potential GND, 0 V, as shown in FIG. 11.

A power-on signal/POWERON is provided to the gate electrode of the p-channel MOS transistor QC, and the VPP voltage is supplied to the drain electrode of the p-channel MOS transistor QC. Similarly, the VPP voltage is also supplied to the drain electrode of the p-channel MOS transistor QC.

The VPP voltage discharge circuit 70 is a circuit for discharging an amount of electrical charges from the value of the VPP voltage potential to the value of the VSS ground voltage potential GND, 0 V, by operating for a given period of time from the timing of the increase of the value of the ½·VAA voltage. During the operation of the VPP voltage discharge circuit 70, the p-channel MOS transistor QC is turned off through the application of the power-on signal/POWERON to the gate of the p-channel MOS transistor QC, and the p-channel MOS transistor QD is turned on from the timing of the increase of the VAA voltage and the ½·VAA voltage. Thereby, an amount of discharge current flows from the value of the VPP voltage potential to the value of the VSS ground voltage potential GND, 0 V, through the p-channel MOS transistor QD and the discharge resistor RD.

(Power-On Sequence)

A schematic waveform diagram showing a power-on sequence for various voltages at main nodes in the power supply voltage control circuit, according to the second embodiment of the present invention, during a power on sequence is shown in FIG. 12.

(a) To begin with, the external power supply voltage VDD starts to increase at time t1, and the logic signal level MINVDD in response to the value of VDD starts to rise up at time t2.

(b) Next, the value of the VPP voltage starts to increase at time t3, and the value of the VPP voltage is maintained at a constant value once a given period of time has elapsed.

(c) Next, at time t4, a power-on signal/POWERON starts to increase and the value of the ½·VAA voltage starts to increase in accordance with the increase of the value of the VAA voltage. At the same time, as shown in FIG. 12, the value of the VPP voltage increases due to capacitive-coupling in accordance with the increase of the value of the ½·VAA voltage.

(d) Next, the value of the power-on signal/POWERON decreases to a zero voltage at time t5.

(e) Next, once the value of the VPP voltage is decreased and stabilized to the constant predetermined value, the power-on reset signal POR is turned on at time t6, and then is kept on the high level of the power-on reset signal POR.

The time period until the value of the increased VPP voltage is decreased and stabilized to the constant predetermined value corresponds to the time duration between the time t4 and the time t5 during the value of the power-on signal/POWERON is being active. During the time period until the value of the increased VPP voltage is decreased and stabilized to the constant predetermined value, an amount of discharge current flows from the value of the VPP voltage potential to the value of the VSS ground voltage potential GND, 0 V, through the p channel MOS transistor QD and the discharge resistor RD by keeping the VPP voltage discharge circuit 70 on an active operational state.

Furthermore, with the power supply voltage control circuit 82 according to the second embodiment of the present invention, the VPP voltage discharge circuit 70 is configured to discharge an amount of current from the value of the VPP voltage potential to the value of the VSS ground voltage, 0 V, in addition to the VPP voltage monitor circuit 50. Therefore, an amount of charges can be discharged in a higher speed manner.

The power supply voltage control circuit 82 according to the second embodiment of the present invention is applicable to the FeRAM configured as shown in FIGS. 1 through 3.

As shown in FIG. 4, an exemplary memory cell array to which the power supply voltage control circuit 82, according to the second embodiment of the present invention, is applicable provides a configuration of the chain FeRAM. Alternatively, as shown in FIG. 6, another exemplary memory cell array to which the power supply voltage control circuit 82, according to the second embodiment of the present invention, is applicable provides a configuration of the FeRAM having DRAM type memory cell.

The power supply voltage control circuit 82 according to the second embodiment of the present invention allows independent optimization of the amount of discharge current flowing from the value of the VPP voltage potential to the value of the VSS voltage potential at the time of power-on, and optimization of the amount of current flowing through the VPP voltage monitor circuit 50 during in an active operational state of the VPP voltage monitor circuit 50.

THIRD EMBODIMENT

A power supply voltage control circuit according to the third embodiment of the present invention is applied to the FeRAM configured as shown in FIGS. 1 through 3, as with the first embodiment.

As shown in FIG. 4, an exemplary memory cell array to which the power supply voltage control circuit, according to the third embodiment of the present invention, is applicable includes a configuration of the chain FeRAM, as with the first embodiment.

Alternatively, as shown in FIG. 6, another exemplary memory cell array to which the power supply voltage control circuit, according to the third embodiment of the present invention, is applicable includes a configuration of the FeRAM having DRAM type memory cell, as with the first embodiment.

The power supply voltage control circuit according to the third embodiment of the present invention supplies a power supply voltage to the memory cell array 10, which includes a plurality of word lines WL extending along the row direction, a plurality of bit lines BL extending along the column direction, a plurality of plate lines PL extending along the row direction, and a plurality of unit cells disposed at intersections of a plurality of word lines WL and a plurality of bit lines BL.

The memory cell array provides a FeRAM having a TC unit series connected memory cell configuration in which a plurality of unit cells is connected in series between the bit line BL and the plate line PL and each unit cell made up of the memory cell transistor T having the drain, the source, and the gate connected to the word line WL, and a ferroelectric capacitor $C_{FE}$ connected in parallel between the source and drain of the memory cell transistor T.

Alternatively, the memory cell array provides a FeRAM having a plurality of DRAM type memory cells in which a plurality of unit cells is connected in a matrix format and each unit cell made up of a memory cell transistor T having the drain connected to the bit line BL, the gate connected to the word line WL, and a ferroelectric capacitor $C_{FE}$ having an electrode connected to the plate line PL and the other electrode connected to the source of the memory cell transistor T.

The word line control circuit 4 includes a plurality of word line drivers 40, which supplies the VPP voltage to the word lines WL; the plate line control circuit 5 includes a plurality of plate line drivers 44, which supplies ½·VAA voltage to the plate lines PL.

Figure 13:
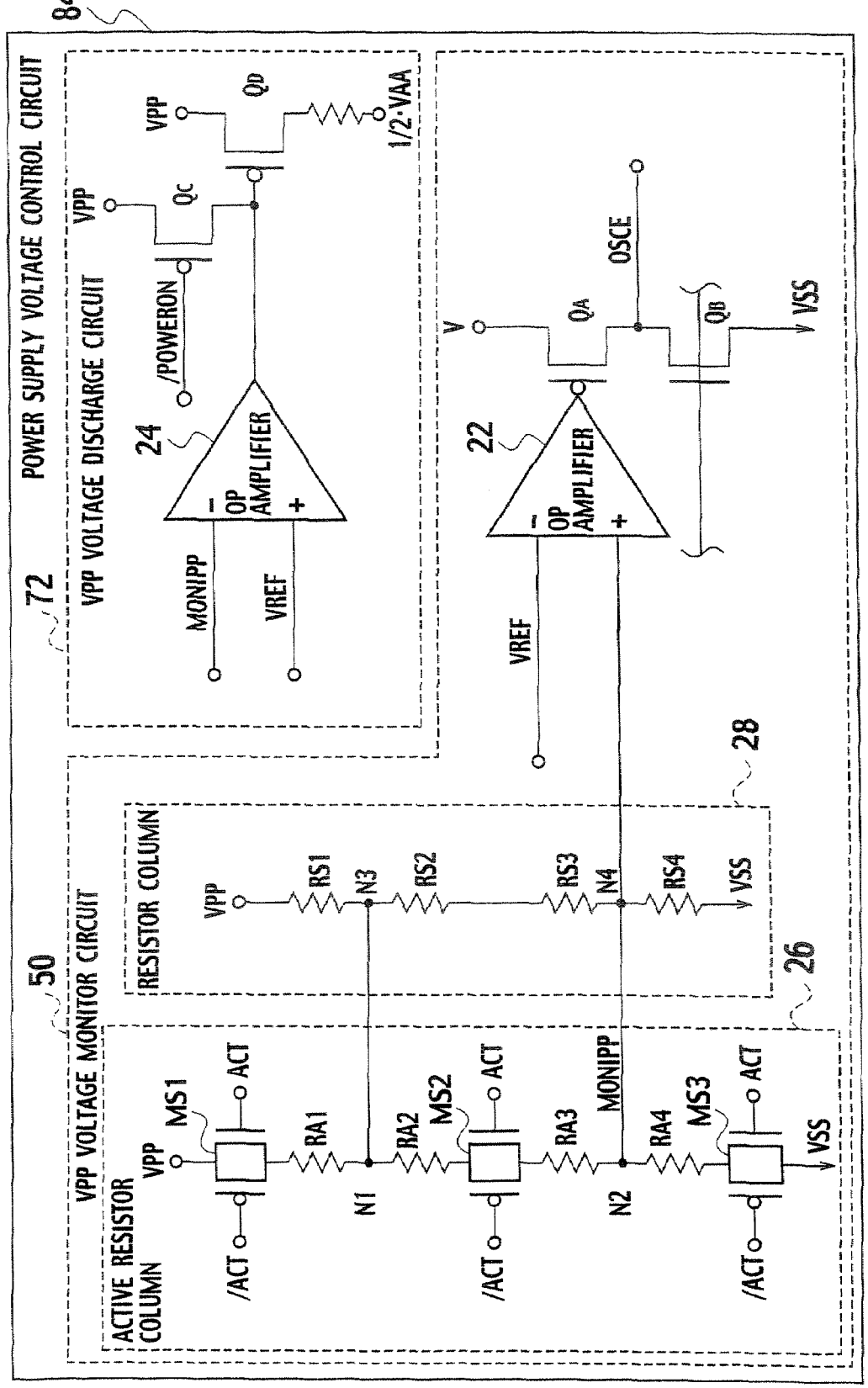
FIG. 13 is a schematic circuit diagram of a VPP voltage monitor circuit and a VPP voltage discharge circuit in a power supply voltage control circuit according to a third embodiment of the present invention.

As shown in FIG. 13, the power supply voltage control circuit 84 comprises the VPP voltage monitor circuit 50 having an active resistor column 26 through which current flows during in an active operational state and a resistor column 28 through which normally current flows even during in a standby state. The VPP voltage monitor circuit 50 monitors the VPP voltage supplied to the word lines WL.

The power supply voltage control circuit 84 according to the third embodiment of the present invention includes the VPP voltage discharge circuit 72, which discharges the value of the VPP voltage applied to the word lines WL.

With the power supply voltage control circuit 84 according to the third embodiment of the present invention, the VPP voltage discharge circuit 72 is configured to discharge an amount of current from the value of the VPP voltage potential to the value of the ½·VAA voltage potential.

The power supply voltage control circuit 84 according to the third embodiment of the present invention includes the VPP voltage discharge circuit 72 that discharges an amount of current so as to provide the current flow from the value of the VPP voltage potential, in addition to the VPP voltage monitor circuit 50.

Figure 14:
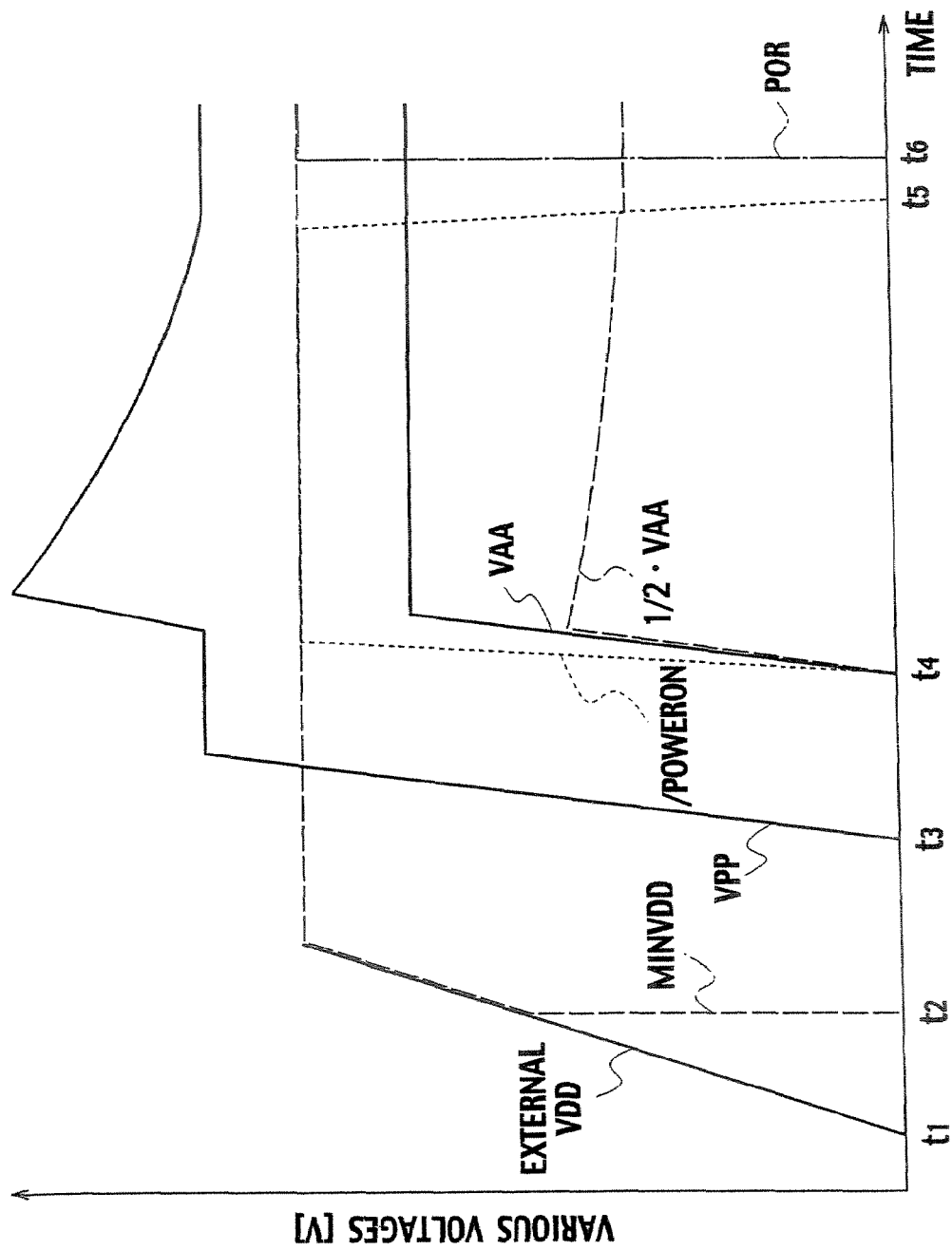
FIG. 14 is a schematic waveform diagram showing a power-on sequence for various voltages at main nodes in the power supply voltage control circuit, according to the third embodiment of the present invention, during a power-on sequence.

The power supply voltage control circuit 84 according to the third embodiment of the present invention is described using FIGS. 13 and 14.

As shown in FIG. 13, the power supply voltage control circuit 84 according to the third embodiment of the present invention includes the VPP potential monitor circuit 50 and the VPP voltage discharge circuit 72.

The VPP voltage monitor circuit 50 includes the same circuit configuration as the power supply voltage control circuit 80 according to the first embodiment of the present invention, and, as shown in FIG. 13, includes the OP amplifier 22 having an input terminal connected to the reference voltage VREF and another input terminal connected to the VPP monitor voltage MONIPP, the p-channel MOS transistor QA having the gate electrode connected to the output terminal of the OP amplifier 22, the n-channel MOS transistor QB series-connected to the p-channel MOS transistor QA, the active resistor column 26 series-coupled to the VPP voltage and the VSS voltage and through which a large amount current flows during in an active operational state, and the resistor column 28 series-coupled to the VPP voltage and the VSS voltage and through which a small amount of current flows normally.

The VPP voltage discharge circuit 72 includes an OP amplifier 24 having an input terminal coupled to the reference voltage VREF and the other input terminal coupled to the VPP monitor voltage MONIPP, a p-channel MOS transistor QD having a gate electrode connected to the output terminal of the OP amplifier 24, a p-channel MOS transistor QC having a source electrode connected to the output terminal of the OP amplifier 24, and a discharge resistor RD connected between the source electrode of the p-channel MOS transistor QD and the terminal of the ½·VAA voltage potential, as shown in FIG. 13.

A power-on signal/POWERON is provided to the gate electrode of the p-channel MOS transistor QC, and the VPP voltage is supplied to the drain electrode of the p-channel MOS transistor QC. Similarly, the VPP voltage is also supplied to the drain electrode of the p-channel MOS transistor QC.

The VPP voltage discharge circuit 72 is a circuit for discharging an amount of electrical charges from the value of the VPP voltage potential to the value of the ½·VAA voltage by operating for a given period of time from the timing of the increase of the value of the ½·VAA voltage. During the operation of the VPP voltage discharge circuit 72, the p-channel MOS transistor QC is turned off through the application of the power-on signal/POWERON to the gate of the p-channel MOS transistor QC, and the p-channel MOS transistor QD is turned on from the timing of the increase of the VAA voltage and the ½·VAA voltage. Thereby, an amount of discharge current flows from the value of the VPP voltage potential to the value of the ½·VAA voltage potential, through the p-channel MOS transistor QD and the discharge resistor RD.

(Power-On Sequence)

A schematic waveform diagram showing a power-on sequence for various voltages at main nodes in the power supply voltage control circuit 84, according to the third embodiment of the present invention, during a power-on sequence is shown in FIG. 14

(a) To begin with, the external power supply voltage VDD starts to increase at time t1, and the logic signal level MINVDD in response to the value of VDD starts to rise up at time t2.

(b) Next, the value of the VPP voltage starts to increase at time t3, and the value of the VPP voltage is maintained at a constant value once a given period of time has elapsed.

(c) Next, at time t4, a power-on signal/POWERON starts to increase and the value of the ½·VAA voltage starts to increase in accordance with the increase of the value of the VAA voltage. The value of the ½·VAA voltage and the value of the VAA voltage are maintained at respective constant values, once a given period of time has elapsed. At the same time, as shown in FIG. 14, the value of the VPP voltage increases due to capacitive-coupling in accordance with the increase of the value of the ½·VAA voltage.

(d) Next, the value of the power-on signal/POWERON decreases to a zero voltage at time t5.

(e) Next, once the value of the VPP voltage is decreased and stabilized to the constant predetermined value, the power-on reset signal POR is turned on at time t6, and then is kept on the high level of the power-on reset signal POR.

The time period until the value of the increased VPP voltage is decreased and stabilized to the constant predetermined value corresponds to the time duration between the time t4 and the time t5, during the value of the power-on signal/POWERON is being active. During the time period until the value of the increased VPP voltage is decreased and stabilized to the constant predetermined value, an amount of discharge current flows from the value of the VPP voltage potential to the value of the ½·VAA voltage potential, through the p channel MOS transistor QD and the discharge resistor RD by keeping the VPP voltage discharge circuit 72 on an active operational state.

Furthermore, with the power supply voltage control circuit 84 according to the third embodiment of the present invention, the VPP voltage discharge circuit 72 is configured to discharge an amount of current from the value of the VPP voltage potential to the value of the ½·VAA voltage potential, in addition to the VPP voltage monitor circuit 50. Therefore, an amount of charges can be discharged in a higher speed manner.

The power supply voltage control circuit 84 according to the third embodiment of the present invention is applicable to the FeRAM configured as shown in FIGS. 1 through 3.

As shown in FIG. 4, an exemplary memory cell array to which the power supply voltage control circuit 84, according to the third embodiment of the present invention, is applicable includes a configuration of the chain FeRAM. Alternatively, as shown in FIG. 6, another exemplary memory cell array to which the power supply voltage control circuit 84, according to the third embodiment of the present invention, is applicable includes a configuration of the FeRAM having DRAM type memory cell.

The power supply voltage control circuit 84 according to the third embodiment of the present invention, as shown in FIGS. 13 and 14, operates for a given period of time from the timing of the increase of the value of the ½·VAA voltage potential, and can prevent unnecessary amount of current discharge by discharging an amount of charges from the value of the VPP voltage potential to the value of the ½·VAA voltage potential instead of to the value of the VSS ground voltage potential.

FOURTH EMBODIMENT

A power supply voltage control circuit according to the fourth embodiment of the present invention is applied to the FeRAM configured as shown in FIGS. 1 through 3, as with the first embodiment.

As shown in FIG. 4, an exemplary memory cell array to which the power supply voltage control circuit, according to the fourth embodiment of the present invention, is applicable includes a configuration of the chain FeRAM, as with the first embodiment.

Alternatively, as shown in FIG. 6, another exemplary memory cell array to which the power supply voltage control circuit, according to the fourth embodiment of the present invention, is applicable includes a configuration of the FeRAM having DRAM type memory cell, as with the first embodiment.

The power supply voltage control circuit according to the fourth embodiment of the present invention supplies a power supply voltage to the memory cell array 10, which includes a plurality of word lines WL extending along the row direction, a plurality of bit lines BL extending along the column direction, a plurality of plate lines PL extending along the row direction, and a plurality of unit cells disposed at intersections of a plurality of word lines WL and a plurality of bit lines BL.

The memory cell array provides a FeRAM having a TC unit series connected memory cell configuration in which a plurality of unit cells is connected in series between the bit line BL and the plate line PL and each unit cell made up of the memory cell transistor T having the drain, the source, and the gate connected to the word line WL, and a ferroelectric capacitor $C_{FE}$ connected in parallel between the source and drain of the memory cell transistor T.

Alternatively, the memory cell array provides a FeRAM having a plurality of DRAM type memory cells in which a plurality of unit cells is connected in a matrix format and each unit cell made up of a memory cell transistor T having the drain connected to the bit line BL, the gate connected to the word line WL, and a ferroelectric capacitor $C_{FE}$ having an electrode connected to the plate line PL and the other electrode connected to the source of the memory cell transistor T.

As shown in FIG. 4 or FIG. 6, the word line control circuit 4 includes a plurality of word line drivers 40, which supplies the VPP voltage to the word lines WL and the plate line control circuit 5 includes a plurality of plate line drivers 44, which supplies ½·VAA voltage to the plate lines PL.

The power supply voltage control circuit comprises the VPP voltage monitor circuit 50 having an active resistor column 26 through which current flows during in an active operational state and a resistor column 28 through which normally current flows even during in a standby state. The VPP voltage monitor circuit 50 monitors the VPP voltage supplied to the word lines WL.

The power supply voltage control circuit according to the fourth embodiment of the present invention includes the VPP voltage discharge circuit 70 or 72 that discharges an amount of current so as to provide the current flow from the value of the VPP voltage potential applied to the word lines WL, in addition to the VPP voltage monitor circuit 50.

As a further alternative, the power supply voltage control circuit according to the fourth embodiment of the present invention firstly increases the value of the higher VPP voltage potential of two potential voltages: VPP and ½·VAA capacitive coupled, up to the value of the voltage potential V1, and then increases the value of the lower ½·VAA voltage potential up to the value of the voltage potential V2, and then raising the value of the VPP voltage potential up to the value of V1+V2.

Figure 15A:
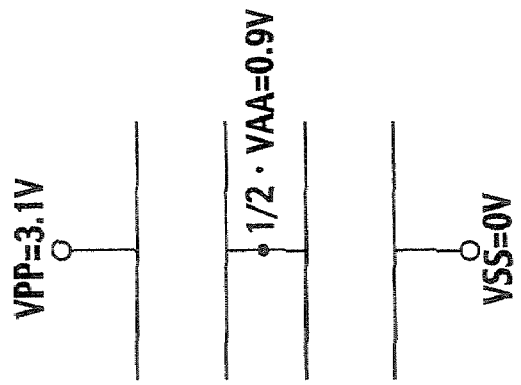
FIG. 15A is a schematic circuit diagram of a power supply voltage control circuit, according to a fourth embodiment of the present invention, showing an outline of an operation thereof.
Figure 15B:
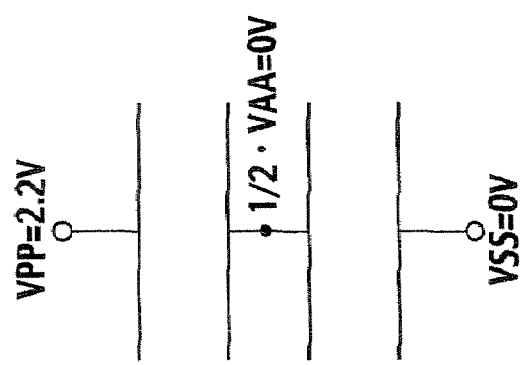
FIG. 15B is a schematic circuit diagram of the power supply voltage control circuit according to the fourth embodiment of the present invention, showing an outline of an operation thereof.
Figure 15C:
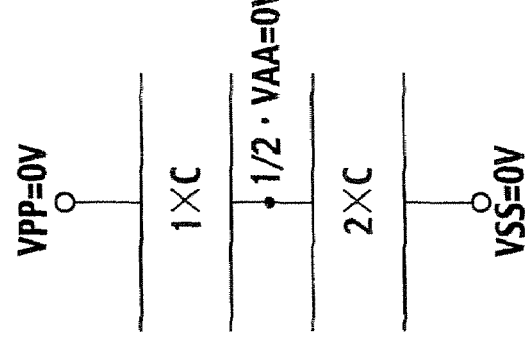
FIG. 15C is a schematic circuit diagram of the power supply voltage control circuit according to the fourth embodiment of the present invention, showing an outline of an operation thereof.
Figure 16:
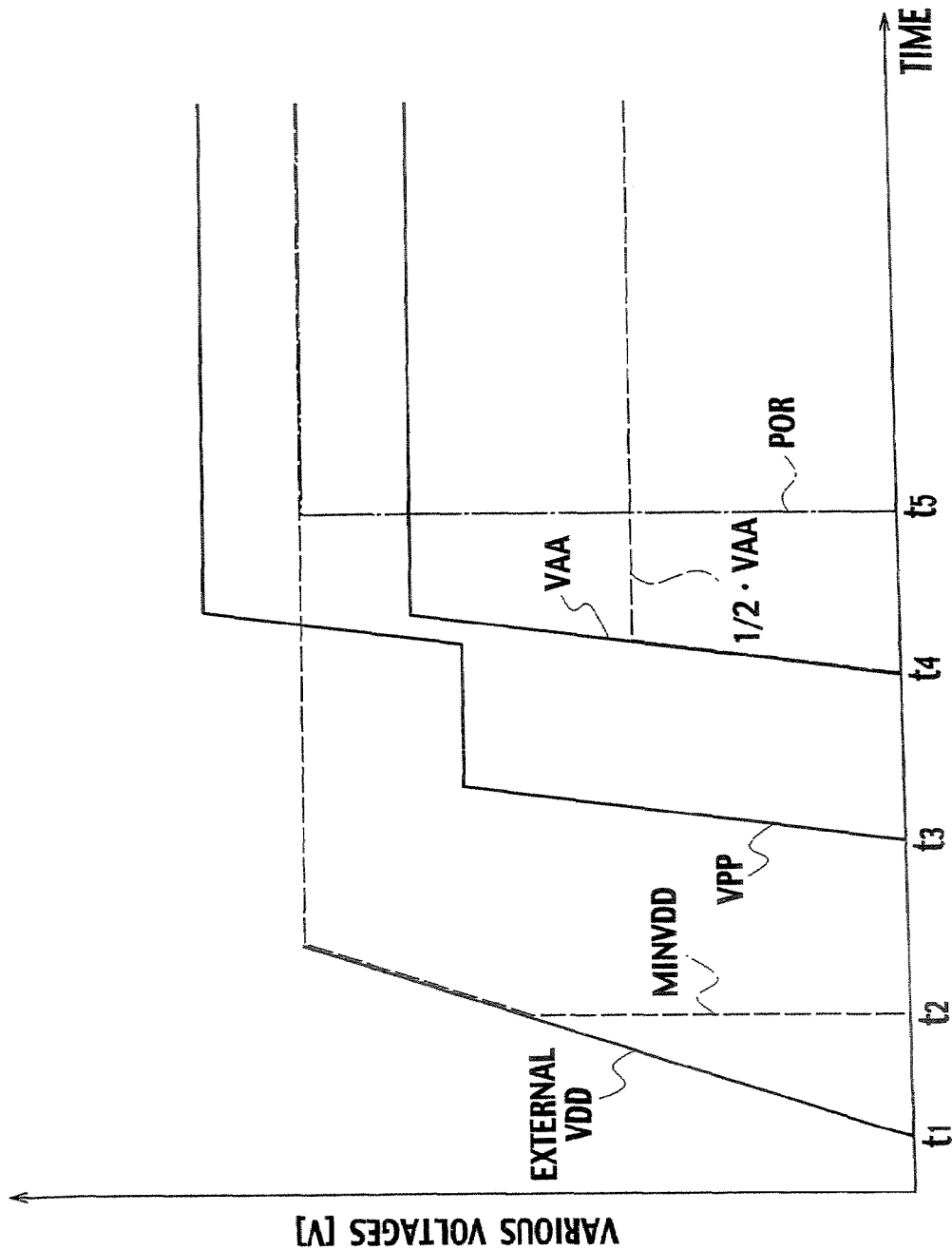
FIG. 16 is a schematic waveform diagram of the power supply voltage control circuit, according to the fourth embodiment of the present invention, showing a power-on sequence for various voltages at main nodes during a power-on sequence.

The power supply voltage control circuit according to the fourth embodiment of the present invention is described using FIGS. 15 and 16.

The power supply voltage control circuit according to the first through the third embodiment of the present invention employs the means for the value of the increased VPP voltage potential due to capacitive-coupling, to decrease and stabilize to the constant predetermined value by discharging an amount of charges from the increased VPP voltage potential.

The power supply voltage control circuit according to the fourth embodiment of the present invention provides a method for increasing the value of the VPP voltage potential in two steps, according to which the value of the ½·VAA voltage potential is increased to a desired voltage potential after the value of the VPP voltage potential is increased to a desired voltage potential.

(VPP Voltage Two-Stage Step-Up Method)
(i) To begin with, as shown in FIG. 15A, the value of the ½·VAA voltage potential is reset to 0 V, and a circuit for generating the value of the ½·VAA voltage potential is reset.
(ii) Next, as shown in FIG. 15B, the value of the VPP voltage potential is increased to 2.2 V while resetting the value of the ½·VAA voltage to 0 V and resetting the circuit for generating the value of the ½·VAA voltage potential. The voltage potentials of diffusion layers and channel regions of a plurality of memory cell transistors T in the memory cell array 10 are set to 0 V, and then a plurality of memory cell transistors T becomes deeply on, and it is conductive between both electrodes of each of the ferroelectric capacitors $C_{FE}$, and thus no destruction of stored data occurs.
(iii) Next, as shown in FIG. 15C, resetting of the ½·VAA voltage potential and the circuit for generates the ½·VAA voltage potential is cancelled and as a result of increasing the value of the VAA voltage potential up to the value of 1.8 V, the value of the ½·VAA voltage potential is increased from the value of 0 V to the value of 0.9 V. The value of the VPP voltage potential increases another value of 0.9 V due to capacitive-coupling and becomes the value of 3.1 V.

(Power-On Sequence)
A schematic waveform diagram showing a power-on sequence for various voltages at main nodes in the power supply voltage control circuit, according to the fourth embodiment of the present invention, during a power-on sequence is shown in FIG. 16.
(a) To begin with, the external power supply voltage VDD starts to increase at time t1, and the logic signal level MINVDD in response to the value of VDD starts to rise up at time t2.
(b) Next, the value of the VPP voltage starts to increase at time t3, and the value of the VPP voltage is maintained at a constant value once a given period of time has elapsed.
(c) Next, the value of the ½·VAA voltage starts to increase in accordance with the increase of the value of the VAA voltage at time t4. The value of the ½·VAA voltage and the value of the VAA voltage are maintained at respective constant values, once a given period of time has elapsed. At the same time, as shown in FIG. 16, the value of the VPP voltage increases due to capacitive-coupling in accordance with the increase of the value of the ½·VAA voltage.
(d) Next, the power-on reset signal POR is turned on at time t5, and then is kept on the high level of the power-on reset signal POR.

The power supply voltage control circuit according to the fourth embodiment of the present invention is applicable to the FeRAM configured as shown in FIGS. 1 through 3.

As shown in FIG. 4, an exemplary memory cell array to which the power supply voltage control circuit, according to the fourth embodiment of the present invention, is applicable includes a configuration of the chain FeRAM. Alternatively, as shown in FIG. 6, another exemplary memory cell array to which the power supply voltage control circuit, according to the fourth embodiment of the present invention, is applicable includes a configuration of the FeRAM having DRAM type memory cell.

The power supply voltage control circuit according to the fourth embodiment of the present invention prevents impairing the reliability of the memory cell transistor without discharging an amount of charges or without increasing the value of the VPP voltage due to capacitive-coupling, by increasing the value of the VPP voltage potential in two steps.

FIFTH EMBODIMENT

A power supply voltage control circuit according to the fifth embodiment of the present invention is applied to the FeRAM configured as shown in FIGS. 1 through 3, as with the first embodiment.

As shown in FIG. 4, an exemplary memory cell array to which the power supply voltage control circuit, according to the fifth embodiment of the present invention, is applicable includes a configuration of the chain FeRAM, as with the first embodiment.

Alternatively, as shown in FIG. 6, another exemplary memory cell array to which the power supply voltage control circuit, according to the fifth embodiment of the present invention, is applicable includes a configuration of the FeRAM having DRAM type memory cell, as with the first embodiment.

The power supply voltage control circuit according to the fifth embodiment of the present invention supplies a power supply voltage to the memory cell array 10, which includes a plurality of word lines WL extending along the row direction, a plurality of bit lines BL extending along the column direction, a plurality of plate lines PL extending along the row direction, and a plurality of unit cells disposed at intersections of a plurality of word lines WL and a plurality of bit lines BL.

The memory cell array provides a FeRAM having a TC unit series connected memory cell configuration in which a plurality of unit cells is connected in series between the bit line BL and the plate line PL and each unit cell made up of the memory cell transistor T having the drain, the source, and the gate connected to the word line WL, and a ferroelectric capacitor $C_{FE}$ connected in parallel between the source and drain of the memory cell transistor T.

Alternatively, the memory cell array provides a FeRAM having a plurality of DRAM type memory cells in which a plurality of unit cells is connected in a matrix format and each unit cell made up of a memory cell transistor T having the drain connected to the bit line BL, the gate connected to the word line WL, and a ferroelectric capacitor $C_{FE}$ having an electrode connected to the plate line PL and the other electrode connected to the source of the memory cell transistor T.

As shown in FIG. 4 or FIG. 6, the word line control circuit 4 includes a plurality of word line drivers 40, which supplies the VPP voltage to the word lines WL and the plate line control circuit 5 includes a plurality of plate line drivers 44, which supplies ½·VAA voltage to the plate lines PL.

As shown in FIG. 11 or FIG. 13, the power supply voltage control circuit comprises the VPP voltage monitor circuit 50 having an active resistor column 26 through which current flows during in an active operational state and a resistor column 28 through which normally current flows even during in a standby state. The VPP voltage monitor circuit 50 monitors the VPP voltage supplied to the word lines WL.

As shown in FIG. 11 or FIG. 13, the power supply voltage control circuit according to the fifth embodiment of the present invention includes the VPP voltage discharge circuit 70 or 72 that discharges an amount of current so as to provide the current flow from the value of the VPP voltage potential applied to the word lines WL, in addition to the VPP voltage monitor circuit 50.

As a further alternative, the power supply voltage control circuit according to the fifth embodiment of the present invention firstly increases the value of the higher VPP voltage of two potential voltages: VPP and ½·VAA capacitive coupled, up to the value of the voltage potential V1 while resetting the value of the lower ½·VAA voltage potential to the value of 0 V, cancels resetting of the lower ½·VAA voltage potential and increase the value of the higher VPP voltage to the value of the voltage potential V2, and then increases the value of the lower ½·VAA voltage potential to the value of the desired voltage potential V3, during which the value of the higher VPP voltage potential is kept on the value of the voltage potential V2, by providing an amount of current flow from the value of the VPP voltage potential to the value of the VSS voltage potential.

Figure 17A:
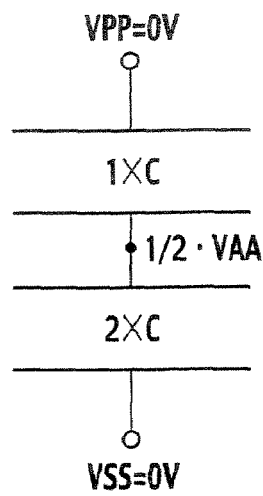
FIG. 17A is a schematic circuit diagram of a power supply voltage control circuit according to a fifth embodiment of the present invention, showing an outline of an operation thereof.
Figure 17B:
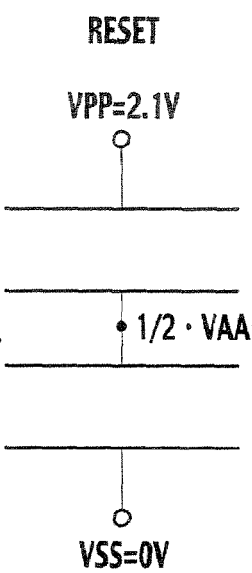
FIG. 17B is a schematic circuit diagram of the power supply voltage control circuit according to the fifth embodiment of the present invention, showing an outline of an operation thereof.
Figure 17C:
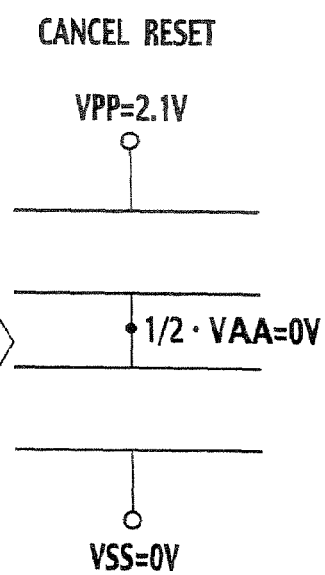
FIG. 17C is a schematic circuit diagram of the power supply voltage control circuit according to the fifth embodiment of the present invention, showing an outline of an operation thereof.
Figure 17D:
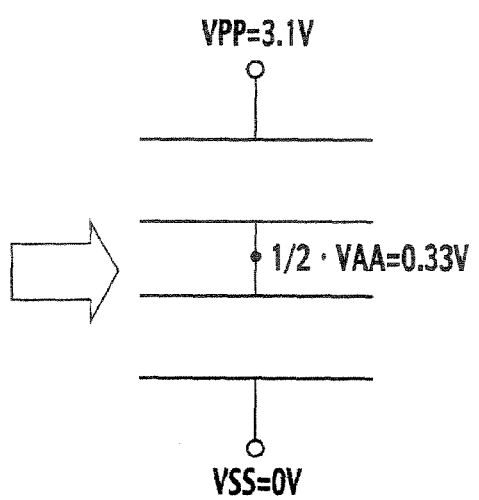
FIG. 17D is a schematic circuit diagram of the power supply voltage control circuit according to the fifth embodiment of the present invention, showing an outline of an operation thereof.
Figure 17E:
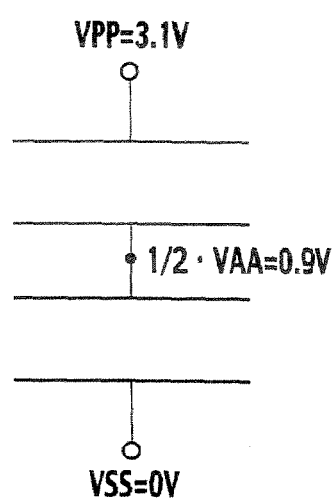
FIG. 17E is a schematic circuit diagram of the power supply voltage control circuit according to the fifth embodiment of the present invention, showing an outline of an operation thereof.
Figure 18:
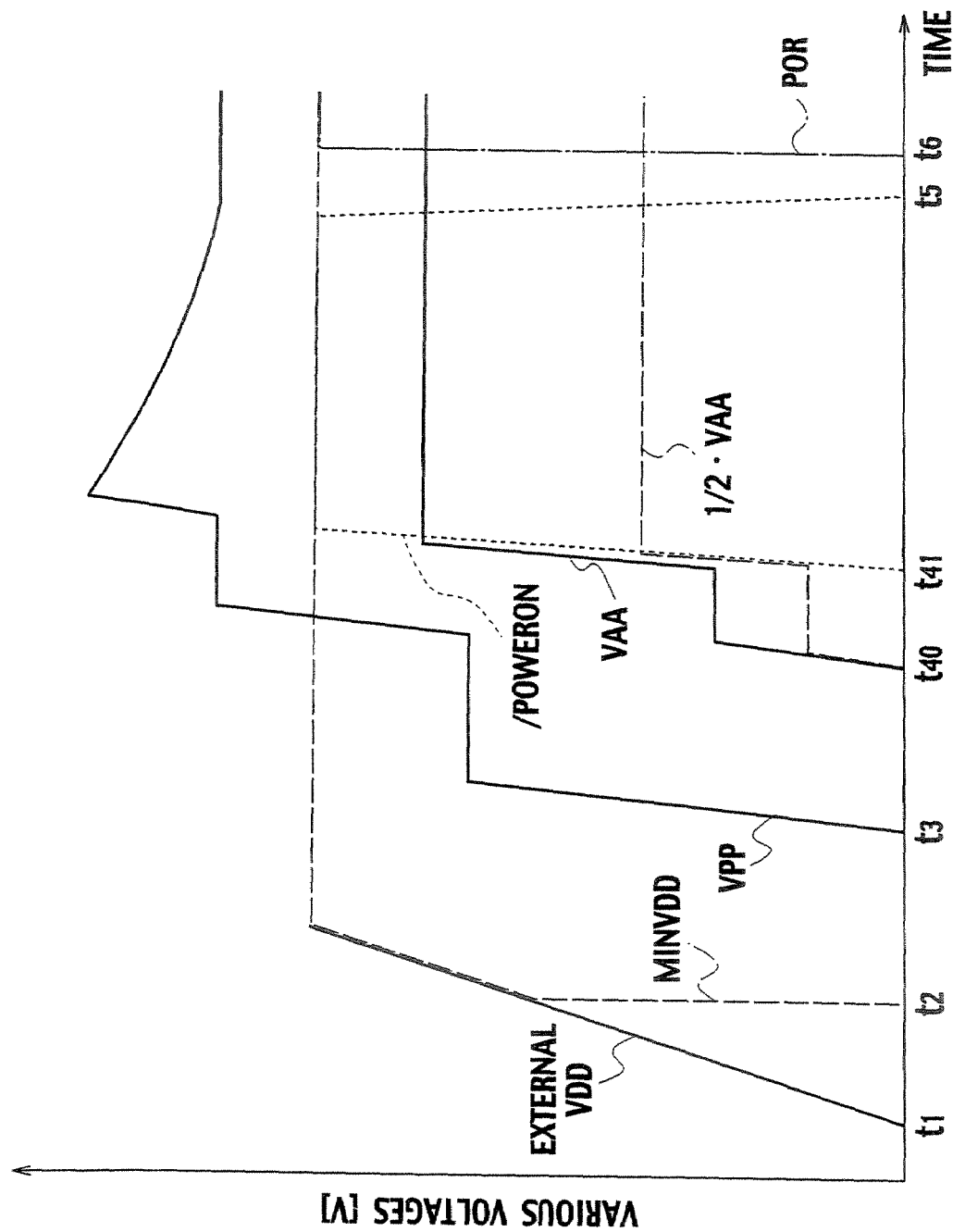
FIG. 18 is a schematic waveform diagram of the power supply voltage control circuit, according to the fifth embodiment of the present invention, showing a power-on sequence for various voltages at main nodes during a power-on sequence.

The power supply voltage control circuit according to the fifth embodiment of the present invention is described using FIGS. 17 and 18.

(VPP Voltage Three-Stage Step-Up Method)

The power supply voltage control circuit according to the fifth embodiment of the present invention provides a method for increasing the value of the VPP voltage potential in three steps. The operation of the power supply voltage control circuit, according to the fifth embodiment of the present invention is described using FIG. 17.

(i) To begin with, as shown in FIG. 17A, the value of the ½·VAA voltage potential is reset to 0 V, and a circuit for generating the value of the ½·VAA voltage potential is reset.

(ii) Next, as shown in FIG. 17B, the value of the VPP voltage potential is increased to 2.1 V while resetting the value of the ½·VAA voltage to 0 V and resetting the circuit for generating the value of the ½·VAA voltage potential. The voltage potentials of diffusion layers and channel regions of a plurality of memory cell transistors T in the memory cell array 10 are set to 0 V, a plurality of memory cell transistors T becomes on, and then it is conductive between both electrodes of each of the ferroelectric capacitors $C_{FE}$, and thus no destruction of stored data occurs.

(iii) Next, as shown in FIG. 17C, resetting of the ½·VAA voltage potential and the circuit for generates the ½·VAA voltage potential is cancelled.

(iv) Next, as shown in FIG. 17D, the value of the VPP voltage potential is increased from the value of 2.1 V to the value of 3.1 V, while canceling resetting of the ½·VAA voltage and the circuit that generates the ½·VAA voltage. The value of the ½·VAA voltage potential is increased from the value of 0 V to the value of 0.33 V due to capacitive-coupling.

(V) Next, as shown in FIG. 17E, the value of the ½·VAA voltage increases from the value of 0.33 V to the value of 0.9 V by providing an amount of current flow from the value of the VPP voltage potential to the value of the VSS voltage potential.

(Power-On Sequence)

A schematic waveform diagram showing a power-on sequence for various voltages at main nodes in the power supply voltage control circuit, according to the fifth embodiment of the present invention, during a power-on sequence is shown in FIG. 18.

(a) To begin with, the external power supply voltage VDD starts to increase at time t1, and the logic signal level MINVDD in response to the value of VDD starts to rise up at time t2.

(b) Next, the value of the VPP voltage starts to increase at time t3, and the value of the VPP voltage is maintained at a constant value once a given period of time has elapsed.

(c) Next, at time t40, the value of the ½·VAA voltage starts to increase in accordance with the increase of the value of the VAA voltage. The value of the ½·VAA voltage and the value of the VAA voltage are maintained at respective constant values, once a given period of time has elapsed. At the same time, as shown in FIG. 18, the value of the VPP voltage increases due to capacitive-coupling in accordance with the increase of the value of the ½·VAA voltage.

(d) Next, at time t41, the power-on signal/POWERON starts to increase and the value of the ½·VAA voltage starts to increase in accordance with the increase of the value of the VAA voltage. The value of the ½·VAA voltage and the value of the VAA voltage are maintained at respective constant values, once a given period of time has elapsed. At the same time, as shown in FIG. 18, the value of the VPP voltage increases due to capacitive-coupling in accordance with the increase of the value of the ½·VAA voltage.

(e) Next, the value of the power-on signal/POWERON decreases to a zero voltage at time t5.

(f) Next, once the value of the VPP voltage is decreased and stabilized to the constant predetermined value, the power-on reset signal POR is turned on at time t6, and then is kept on the high level of the power-on reset signal POR.

The time period until the value of the increased VPP voltage is decreased and stabilized to the constant predetermined value corresponds to the time duration between the time t41 and the time t5, during the value of the power-on signal/ POWERON is being active. During the time period until the value of the increased VPP voltage is decreased and stabilized to the constant predetermined value, an amount of discharge current flows from the value of the VPP voltage potential to the value of the VSS ground voltage potential or the value of the ½·VAA voltage potential, through the p channel MOS transistor QD and the discharge resistor RD by keeping the VPP voltage discharge circuit 70 or 72 on an active operational state.

With the power supply voltage control circuit according to the fifth embodiment of the present invention, the more amount of discharge current from the VPP voltage potential is generated than with the power supply voltage control circuit according to the fourth embodiment of the present invention. However, with the power supply voltage control circuit according to the fourth embodiment of the present invention, if there is some variation in the value of capacitance, during increasing the value of the VPP voltage potential in accordance with the increase of the value of the ½·VAA voltage by utilizing capacitive-coupling, the increase of the value of the VPP voltage potential cannot be carried out correctly. According to the power supply voltage control circuit according to the fifth embodiment of the present invention, however, such a problem can be resolved and the increase of the value of the VPP voltage potential can be achieved correctly.

The power supply voltage control circuit according to the fifth embodiment of the present invention is applicable to the FeRAM configured as shown in FIG. 1 and is also applicable to the FeRAM configured as shown in FIG. 2.

As shown in FIG. 5, an exemplary memory cell array to which the power supply voltage control circuit according to the fifth embodiment of the present invention is applicable includes a configuration of the chain FeRAM. Alternatively, as shown in FIG. 6, another exemplary memory cell array to which the power supply voltage control circuit, according to the fifth embodiment of the present invention, is applicable may have a configuration of the FeRAM having DRAM type memory cell.

According to the power supply voltage control circuit of the fifth embodiment of the present invention, (i) the value of the VPP voltage potential is increased while resetting the value of the ½·VAA voltage potential to the value of 0 V, (ii) the value of the VPP voltage potential is increased while canceling resetting of the ½·VAA voltage potential, and (iii) further, the value of the VPP voltage potential is increased by increasing the value of the ½·VAA voltage potential. The power supply voltage control circuit according to the fifth embodiment of the present invention can reduce the amount of discharged charges, by increasing the value of the VPP voltage potential in three steps.

OTHER EMBODIMENTS

As described above, the present invention has been described through the first through the fifth embodiment; however, it should not be perceived that descriptions and drawings forming a part of this disclosure are intended to limit the spirit and scope of the present invention. Various alternative embodiments, working examples, and operational techniques will become apparent from this disclosure for those skilled in the art.

For example, the configuration of the nonvolatile ferroelectric semiconductor memory cell according to the embodiments of the present invention is not limited to the chain FeRAM cell configuration and the FeRAM having a DRAM type memory cell configuration, but may also be a memory cell configuration of a ferroelectric gate-type semiconductor memory (1-transistor FeRAM) including ferroelectric capacitors as gate capacitors.

Moreover, the configuration of the nonvolatile ferroelectric semiconductor memory cell according to the embodiments of the present invention is not limited to the FeRAM cell configuration, but may also be a memory cell configuration of a Flash memory including NAND, AND, NOR types, two transistor/cell and three transistor/cell types and so on.

As such, the present invention may naturally include various embodiments not described herein. Therefore, the technical scope of the present invention should be defined only by items for specifying the invention according to the appended claims that are regarded appropriate according to the above description.

While the present invention has been described according to the first through the fifth embodiment, these embodiments and drawings constituting a part of this disclosure do not limit the scope of the present invention. This disclosure shows those skilled in the present invention a variety of embodiments, alternative embodiments, and operational technologies.

Needless to say, the present invention includes a variety of embodiments or the like not disclosed herein. Therefore, the technical scope of the present invention should be defined by only inventive descriptions according to the claimed invention, which is appropriate according to the aforementioned descriptions.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation. Various modifications will become possible for those skilled in the art after receiving the teachings of the present disclosure without departing from the scope thereof.

What is claimed is:

1. A power supply voltage control circuit supplying a power supply voltage to a memory cell array, including a plurality of word lines extending along row direction, a plurality of bit lines extending along column direction, a plurality of plate lines extending along the row direction, and a plurality of unit cells disposed at intersections of a plurality of word lines and a plurality of bit lines, comprising:

a word line control circuit for supplying a first voltage to the word lines; and a plate line control circuit for supplying a second voltage to the plate lines;

wherein the power supply voltage control circuit provides an amount of current flow from the first voltage so as to keep the first voltage potential almost constant during increasing a value of the second voltage in a power-on sequence in which firstly increases a value of the higher first voltage of two potential voltages: the first voltage and the second voltage capacitive coupled, and then increases a value of the lower second voltage.

2. The power supply voltage control circuit of claim 1, further comprising:
a first voltage monitor circuit configured to monitor the first voltage applied to the word lines including an active resistor column through which large amount of current flows in an active operational state, and a resistor column, which is connected in parallel to the active resistor column and through which an amount of current flows normally.

3. The power supply voltage control circuit of claim 1, further comprising:
a first voltage discharge circuit configured to discharge an amount of charges from the first voltage potential applied to the word lines.

4. The power supply voltage control circuit of claim 1, wherein the memory cell array comprises a FeRAM having a TC unit series connected memory cell configuration in which a plurality of unit cells is connected in series between the bit line and the plate line and each unit cell made up of the cell transistor having drain, source, and gate connected to the word line, and a ferroelectric capacitor $C_{FE}$ connected in parallel between the source and drain of the cell transistor.

5. The power supply voltage control circuit of claim 1, wherein the memory cell array comprises a FeRAM having a DRAM type memory cell configuration in which a plurality of unit cells is connected in a matrix format and each unit cell made up of a cell transistor having drain connected to the bit line, gate connected to the word line, and a ferroelectric capacitor $C_{FE}$ having an electrode connected to the plate line and the other electrode connected to the source of the cell transistor.

6. The power supply voltage control circuit of claim 3, wherein the first voltage discharge circuit discharges an amount of charges from the first voltage potential to the ground voltage potential.

7. The power supply voltage control circuit of claim 3, wherein the first voltage discharge circuit discharges an amount of charges from the first voltage potential to the second voltage potential.

8. The power supply voltage control circuit of claim 2, wherein the current flowing from the first voltage potential to the ground voltage potential is along both through the active resistor column and the resistor column of the first voltage monitor circuit.

9. A power supply voltage control circuit supplying a power supply voltage to a memory cell array, including a plurality of word lines extending along row direction, a plurality of bit lines extending along column direction, a plurality of plate lines extending along the row direction, and a plurality of unit cells disposed at intersections of a plurality of word lines and a plurality of bit lines, comprising:
a word line control circuit for supplying a first voltage to the word lines; and
a plate line control circuit for supplying a second voltage to the plate lines;
wherein the power supply voltage control circuit firstly increases the value of the higher first voltage potential of two potential voltages: the first voltage and the second voltage capacitive coupled, up to the value of a voltage potential V1, and then increases the value of the second voltage potential up to the value of a voltage potential V2, and then increasing the value of the first voltage potential up to the value of a voltage potential V1 plus V2.

10. The power supply voltage control circuit of claim 9, further comprising:
a first voltage monitor circuit configured to monitor the first voltage applied to the word lines including an active resistor column through which large amount of current flows in an active operational state, and a resistor column, which is connected in parallel to the active resistor column and through which an amount of current flows normally.

11. The power supply voltage control circuit of claim 9, further comprising:
a first voltage discharge circuit configured to discharge an amount of charges from the first voltage potential applied to the word lines.

12. The power supply voltage control circuit of claim 9, wherein the memory cell array comprises a FeRAM having a TC unit series connected memory cell configuration in which a plurality of unit cells is connected in series between the bit line and the plate line and each unit cell made up of the cell transistor having drain, source, and gate connected to the word line, and a ferroelectric capacitor $C_{FE}$ connected in parallel between the source and drain of the cell transistor.

13. The power supply voltage control circuit of claim 9, wherein the memory cell array comprises a FeRAM having a DRAM type memory cell configuration in which a plurality of unit cells is connected in a matrix format and each unit cell made up of a cell transistor having drain connected to the bit line, gate connected to the word line, and a ferroelectric capacitor $C_{FE}$ having an electrode connected to the plate line and the other electrode connected to the source of the cell transistor.

14. The power supply voltage control circuit of claim 11, wherein the first voltage discharge circuit discharges an amount of charges from the first voltage potential to the ground voltage potential.

15. The power supply voltage control circuit of claim 11, wherein the first voltage discharge circuit discharges an amount of charges from the first voltage potential to the second voltage potential.

16. The power supply voltage control circuit of claim 10, wherein the current flowing from the first voltage potential to the ground voltage potential is along both through the active resistor column and the resistor column of the first voltage monitor circuit.

17. A power supply voltage control circuit supplying a power supply voltage to a memory cell array, including a plurality of word lines extending along row direction, a plurality of bit lines extending along column direction, a plurality of plate lines extending along the row direction, and a plurality of unit cells disposed at intersections of a plurality of word lines and a plurality of bit lines, comprising:
a word line control circuit for supplying a first voltage to the word lines; and
a plate line control circuit for supplying a second voltage to the plate lines;
wherein the power supply voltage control circuit firstly increases the value of the higher first voltage of two potential voltages: the first voltage and the second voltage capacitive coupled, up to the value of a voltage potential V1 while resetting the value of the lower second voltage potential to the value of a voltage potential 0 V, cancels resetting of the lower second voltage potential and increases the value of the higher first voltage to the value of a voltage potential V2, and then increases the value of the lower second voltage potential to the value of a desired voltage potential V3, during which the value of the higher first voltage potential is kept on the value of the voltage potential V2, by providing an amount of current flow from the value of the first voltage potential to the value of the ground voltage potential.

18. The power supply voltage control circuit of claim 17, further comprising:
a first voltage discharge circuit configured to discharge an amount of charges from the first voltage potential applied to the word lines.

19. The power supply voltage control circuit of claim 18, wherein the first voltage discharge circuit discharges an amount of charges from the first voltage potential to the ground voltage potential.

20. The power supply voltage control circuit of claim 18, wherein the first voltage discharge circuit discharges an amount of charges from the first voltage potential to the second voltage potential.

* * * * *